United States Patent
Chang et al.

(10) Patent No.: US 11,137,691 B1
(45) Date of Patent: Oct. 5, 2021

(54) FIXING BLANK MASK DEFECTS BY REVISING LAYOUTS

(71) Applicant: TAIWAN SEMICONDUCTOR MANUFACTURING CO., LTD., Hsinchu (TW)

(72) Inventors: Shih-Ming Chang, Hsinchu (TW); Wei-Hsuan Liang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/837,949

(22) Filed: Apr. 1, 2020

(51) Int. Cl.
*G03F 7/20* (2006.01)

(52) U.S. Cl.
CPC ................. *G03F 7/70616* (2013.01)

(58) Field of Classification Search
CPC ..... G06T 7/0004; G06T 7/001; G06T 7/0006; G03F 1/72; G03F 1/36; G03F 7/7065; G03F 1/24; G03F 1/84; G03F 7/705; G03F 1/30; G03F 1/22; G03F 7/70466; G03F 7/70616; G03F 7/70433; G01N 21/9501; G06F 30/398; G06F 17/5081; G06F 30/39; H01L 21/0274
See application file for complete search history.

(56) References Cited

U.S. PATENT DOCUMENTS

| | | | |
|---|---|---|---|
| 8,796,666 B1 | 8/2014 | Huang et al. | |
| 8,954,899 B2 | 2/2015 | Wu et al. | |
| 9,093,530 B2 | 7/2015 | Huang et al. | |
| 9,367,655 B2 | 6/2016 | Shih et al. | |
| 9,390,217 B2 | 7/2016 | Wang et al. | |
| 9,479,100 B2 | 10/2016 | Araki et al. | |
| 9,548,303 B2 | 1/2017 | Lee et al. | |
| 9,576,099 B2 | 2/2017 | Chang et al. | |
| 9,594,862 B2 | 3/2017 | Lin et al. | |
| 9,865,542 B2 | 1/2018 | Liaw et al. | |
| 9,870,443 B2 | 1/2018 | Huang et al. | |
| 2013/0273463 A1* | 10/2013 | Wagner | B82Y 40/00 430/5 |
| 2018/0348641 A1* | 12/2018 | Kim | G03F 7/70641 |

* cited by examiner

*Primary Examiner* — Mesfin T Asfaw
(74) *Attorney, Agent, or Firm* — McDermott Will & Emery LLP

(57) ABSTRACT

A method of adjusting a layout pattern includes shifting or rotating an entire layout pattern based on information of a plurality of defects of a mask-blank to avoid an impact of first defects of the plurality of defects when the layout pattern is produced as a mask on the mask-blank. The method includes adjusting the layout pattern of the mask at a first location based on information of a second defect of a remaining of the plurality of defects to reduce an impact of the second defect when the layout pattern in projected on a wafer. The method also includes adjusting the layout pattern of the mask at a second location based on information of a third defect of the remaining of the plurality of defects and distinct from the second defect to shift an impact position of the third defect when the layout pattern in projected on the wafer.

20 Claims, 15 Drawing Sheets

FIXING BLANK MASK DEFECTS BY REVISING LAYOUTS

BACKGROUND

During an integrated circuit (IC) design, a number of layout patterns of the IC, for different steps of IC processing, are generated. The layout patterns include geometric shapes corresponding to structures to be fabricated on a wafer. The layout patterns may be produced by projecting. e.g., imaging, a mask on the wafer. The mask also includes a layout pattern that is produced on a clean (with no pattern) semiconductor substrate or a mask-blank. Thus, the masks include a layout pattern of the IC or a layout pattern of a portion of the IC that is created on the mask-blank. A lithography process transfers a layout pattern of the mask to the wafer such that etching, implantation, or other steps are applied only to predefined regions of the wafer.

A reflective mask is used during extreme ultraviolet (EUV) lithography processes to form an integrated circuit having smaller feature sizes. Reflective masks are vulnerable to manufacturing/fabrication defects, such as oxidation, and are easily damaged. Therefore, a number of defects may exist on the mask-blank that can affect, e.g., damage, the layout patterns that are produced as patterned masks on the mask-blanks. In addition, the damage to the layout pattern of the mask may impact the fabricated circuit on the wafer. An efficient mask layout adjustment process is desirable to adjust the layout pattern of a mask based on the defect of the mask-blank to avoid the impact of the defects on the layout pattern that is produced on the wafer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
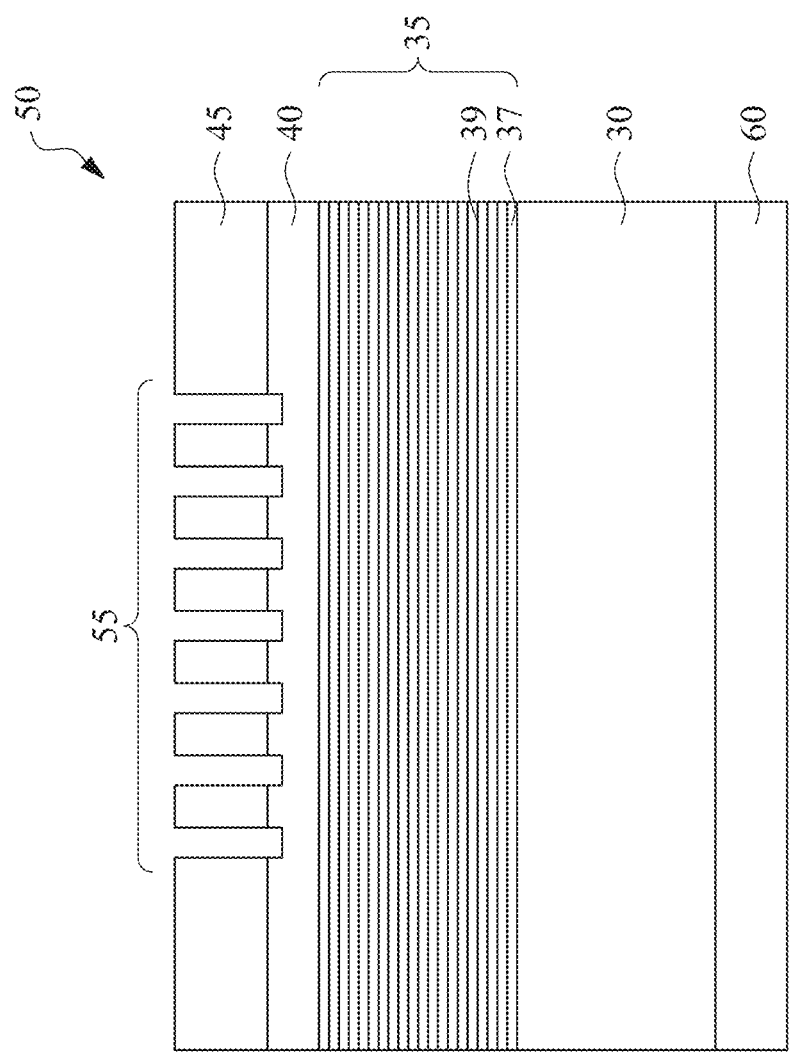
FIG. 1 shows a cross-sectional view of a reflective mask in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above." "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

The present disclosure is generally related to lithography systems and methods. More particularly, it is related to apparatuses and methods for analyzing and adjusting the layout pattern of a mask to avoid and/or reduce the impact of mask defects on the layout pattern of the mask. Patterns on a layout pattern or a portion of the patterns on the layout pattern of a semiconductor circuit are initially created as layout patterns of a mask on a clean semiconductor substrate, e.g., a "blank mask" or a mask-blank. Later, the mask is projected on the wafer to produce the patterns of the layout pattern on the wafer. The clean semiconductor substrate does not initially have a layout pattern and thus it is a mask-blank. However, the mask-blank has one or more defects that are created during manufacturing and/or handling of the mask-blank, in some embodiments.

When a patterned photo mask is manufactured from a mask-blank having a defect, a layout pattern of the mask associated with the layout pattern of the wafer, may be affected by the defect. The defect may modify one or more features. e.g., one or more dimensions of the layout pattern on the mask, and when such a photo mask is imaged on the wafer, the layout pattern on the wafer may be impacted by the defect of the mask. In some embodiments, a layout pattern of the mask associated with a connection line of the layout pattern on the wafer lands on or near the defect and when the mask is imaged on the wafer, the critical dimension (CD) of the layout pattern is reduced because of the defect.

An initial method to reduce the impact of the defects of the mask-blank on the imaged layout pattern on the wafer, includes rotating and/or shifting the layout pattern of the mask such that the critical features of the layout pattern of the mask do not land on or near the defects. In some embodiments, the mask-blank has reference marks to indicate reference points for the mask-blank defining coordinates in the mask-blank, and the defects of the mask-blank are reported with respect to the reference points. An analyzer module receives the defect data from a defect detection system, where the defect data may include a number of the defects and a location and a size, e.g., an extent and height of each of the defects. The analyzer module shifts and/or rotates the layout pattern to be formed on the mask, based on the defect data, such that no critical feature of the layout pattern of the mask lands on a defect and when the mask is imaged on the wafer, the layout pattern on the wafer may not be impacted by the defects of the mask. In some embodiments, the critical features of the layout pattern of the mask include connection lines and/or areas having tightly packed elements such as transistors.

In some embodiments, the mask-blank has a number of defects and the analyzer module avoids the impact of some of the defect (a first portion of defects), however, critical features of the layout pattern on the mask may land on or near the remaining defects (a second portion of defects). In some embodiments, the analyzer module modifies, e.g., adjusts or revises, the pattern of the layout pattern on the mask such that the impact of the defect is incorporated into the layout pattern of the mask and when the mask is imaged on the wafer, the layout pattern on the wafer is not impacted by the defect of the mask. In some embodiments, the analyzer module modifies, adds additional patterns at or near the defects to the layout pattern of the mask, e.g., add phase shift segments to the layout pattern of the mask. The additional patterns may be designed to transfer the location of the impact of the defect, when the mask is imaged on the wafer, further away from critical features.

Figure 2:
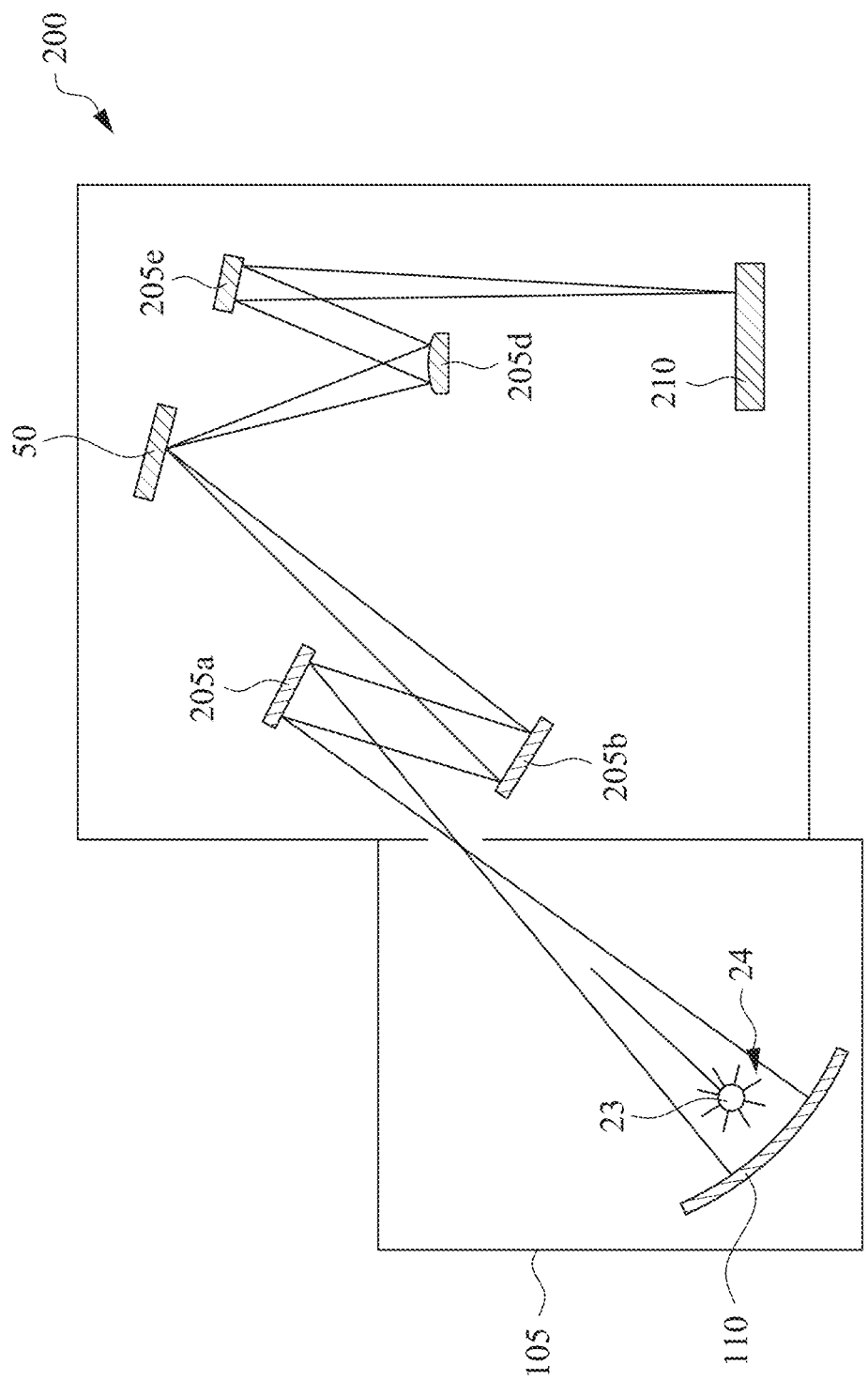
FIG. 2 shows a schematic view of an EUV lithography exposure tool in accordance with some embodiments of the present disclosure.

FIG. 1 shows a cross-sectional view of a reflective EUV mask 50 in accordance with some embodiments of the present disclosure. The terms mask, photomask, and reticle may be used interchangeably. In some embodiments, the reflective mask 50 is used in an exposure device 200 as shown in FIG. 2. The reflective mask 50 includes a substrate 30, reflective multiple layers (ML) 35 that are deposited on the substrate 30, a conductive backside coating 60, a capping layer 40, and an absorption layer 45. In some embodiments, the material of the substrate 30 includes $TiO_2$ doped $SiO_2$, or other suitable materials with low thermal expansion. In some embodiments, the substrate 30 includes fused quartz and has a thickness of about 6.4 mm. In some embodiments, the ML 35 includes a plurality of film pairs, such as molybdenum-silicon (Mo/Si) film pairs (e.g., a layer of molybdenum 39 above or below a layer of silicon 37 in each film pair). In some embodiments, the ML 35 has 40 to 50 pairs of the molybdenum layer 39 and the silicon layer 37 and each molybdenum layer 39 has a thickness of about 3 nm and each silicon layer 37 has a thickness of about 4 nm. Thus, in some embodiments, the ML 35 has a thickness between about 280 nm to about 350 nm. Alternatively, the ML 35 may include molybdenum-beryllium (Mo/Be) film pairs, or other suitable materials that are configured to highly reflect the EUV light. The capping layer 40 may include ruthenium (Ru) and may be disposed on the ML 35 for protection and may have a thickness of about 2.5 nm. In some embodiments, the capping layer 40 includes silicon (Si) and is disposed on the ML 35 for protection and has a thickness of about 4 nm. In some embodiments, the absorption layer 45 that includes a tantalum boron nitride (TaBN) layer is deposited over the ML 35 and the capping layer 40. In some embodiments, the absorption layer 45 is patterned with patterns 55 to define a layer of an integrated circuit (IC). In some embodiments, the reflective mask 50 includes a conductive backside coating 60. In some embodiments, the backside coating 60 includes chromium nitride (CrN) and has a thickness of about 70 nm to about 100 nm. In some embodiments, another reflective layer may be deposited over the ML 35 and to be patterned to define a layer of an integrated circuit, thereby forming an EUV phase shift reticle. In some embodiments, the absorption layer 45 includes one or a combination of TaBO, TaBN, TaNO, and TaN and has a thickness between about 50 nm and about 70 nm.

FIG. 2 shows a schematic view of an EUV lithography (EUVL) exposure tool in accordance with some embodiments of the present disclosure. The EUVL exposure tool of FIG. 2 includes the exposure device 200 that exposes a photoresist coated substrate, a target semiconductor substrate 210, to a patterned beam of EUV light. The exposure device 200 is an integrated circuit lithography tool such as a stepper, or scanner, device using a contact and/or proximity mask, etc., provided with one or more reflective optics 205a, 205b, for example, to illuminate a patterning optic, such as a reticle, e.g., a reflective mask 50, with a beam of EUV light, to produce a patterned beam, and one or more reduction projection optics 205d, 205e, for projecting the patterned beam onto the target semiconductor substrate 210. A mechanical assembly (not shown) may be provided for generating a controlled relative movement between the target semiconductor substrate 210 and patterning optic. e.g., a reflective mask 50. As further shown, the EUVL exposure tool of FIG. 2, further includes the EUV radiation source inside the chamber 105 including a plasma plume 23 at a zone of excitation 24 emitting EUV light that is collected and reflected by a collector mirror 110 into the exposure device 200 to irradiate the target semiconductor substrate 210.

Figure 3B:
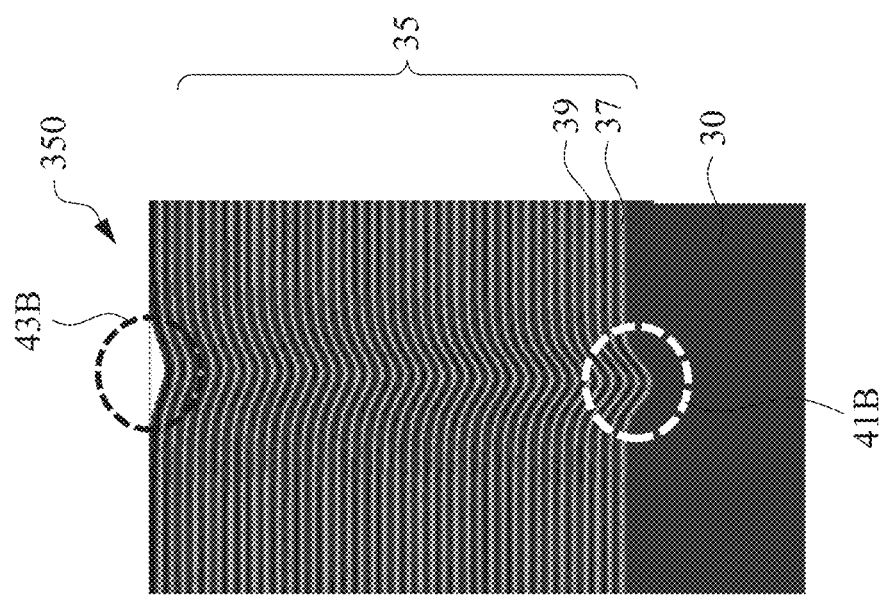
FIGS. 3A and 3B show cross-sectional views of a reflective mask having defects.
Figure 3A:
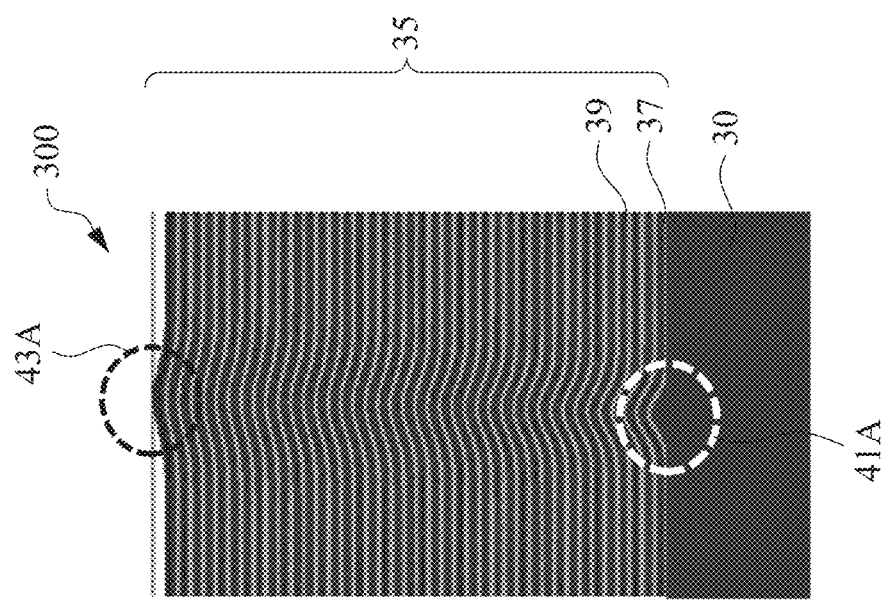

FIGS. 3A and 3B show cross-sectional views of a reflective mask having defects. In some embodiments, FIGS. 3A and 3B illustrate mask-blanks before a layout pattern is incorporated into the mask-blanks. In some embodiments, the defects of the mask are one or more of a bump 41A on top of the substrate layer 30, or a pit 41B on top of the substrate layer 30. The reflective masks 300 and 350 of FIG. 3A and FIG. 3B that are consistent with the reflective mask 50 of FIG. 1 include the reflective ML 35 deposited on the substrate 30 and include a plurality of film pairs, such as molybdenum-silicon (Mo/Si) film pairs, including a layer of molybdenum 39 above or below a layer of silicon 37 in each film pair. As shown by the reflective mask 300, the bump 41A on top of the substrate 30 creates, e.g., induces, a similar bump 43A on top of the reflective ML 35. Also, each of the reflective ML 35 show a bump similar to the bump 41A and the bump 43A. Because the reflected light that produces the layout pattern on the wafer is reflected from the reflective ML 35, the bumps of the layers of the reflective ML 35 may impact the produced layout pattern on the wafer.

As shown by the reflective mask 350, the pit 41B on top of the substrate 30 creates, e.g., induces, a pit 43B on top of the reflective ML 35. Similarly, each of the reflective ML 35 show a pit similar to the pit 41B and the pit 43B. In addition, because the reflected light that produces the layout pattern on the wafer is reflected from the reflective ML 35, the pits of the layers of the reflective ML 35 may impact the produced layout pattern on the wafer. One or more defects may exist on or within the reflective ML 35, the capping layer 40 and/or the absorption layer 45.

Figure 4:
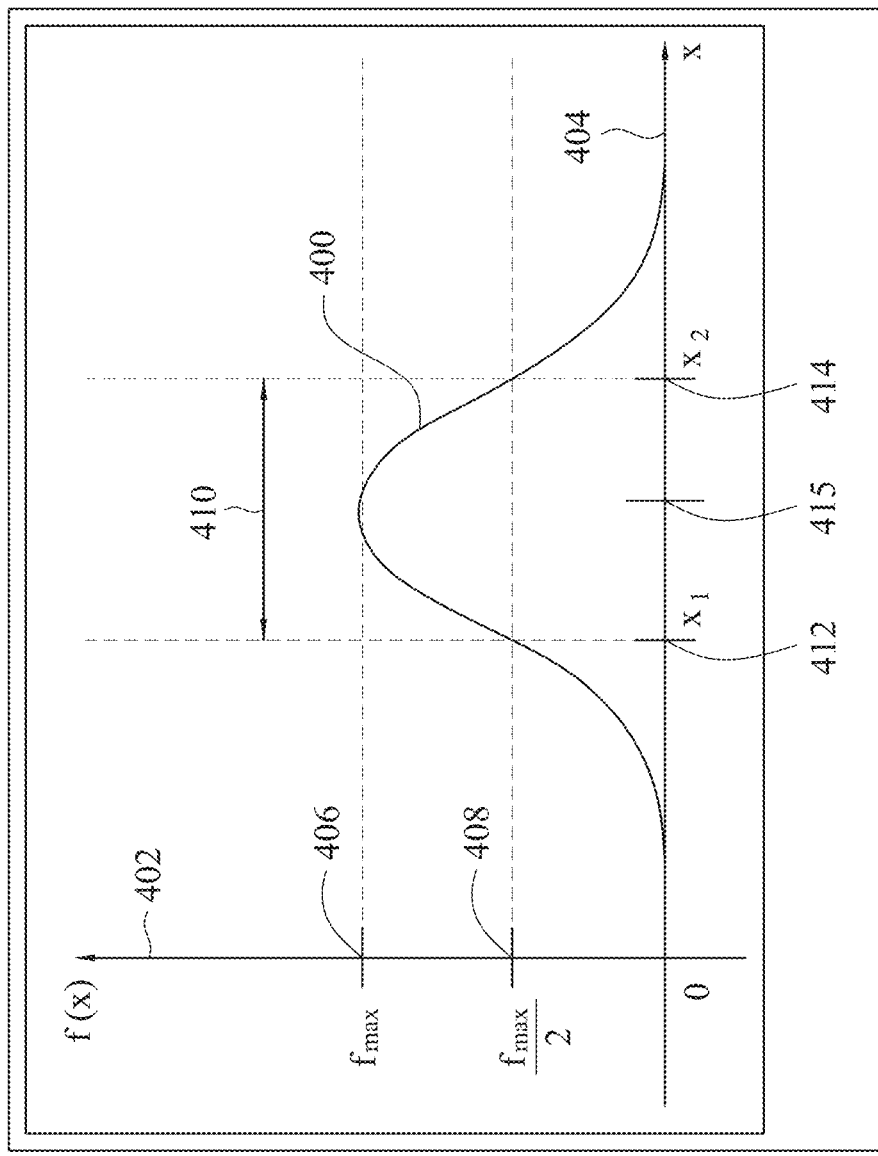
FIG. 4 shows a cross-sectional profile of a defect of a mask.

FIG. 4 shows a cross-sectional profile of a defect 400 of a mask in accordance with some embodiments of the present disclosure. In some embodiments, the profile is consistent with the profile of the bump 43A on top of the reflective ML 35. As shown, the defect 400 is drawn as a Gaussian shape with a height-coordinate 402 versus a distance-coordinate 404 and is located around a center 415, which is a center of the defect, in some embodiments. In some embodiments, an extent 410 of the defect is defined as a full width at half maximum (FWHM), which is a distance between two ends 412 and 414 having half of a maximum height 406. Thus, the two ends 412 and 414 have a height 408, which is half of the maximum height 406. Although, the defect 400 shows a bump having a Gaussian shape height, a similar Gaussian shape profile having a depth can be used for a pit and the FWHM extent 410 and maximum depth of the pit is similarly defined. In some other embodiments, the defect is a pit or a bump, the maximum depth is between about 0.1 nm to about 5.0 nm. e.g., 1.5 nm, and the FWHM extent is between about 1.0 nm to about 500 nm, e.g., 100 nm. In some embodiments, the defects smaller than 0.1 nm do not impact the layout pattern on the wafer and are not detected. And defects larger than 5.0 nm are avoided by rotating and/or translating the entire layout pattern. In some embodiments, the layout pattern of the mask is imaged, e.g., projected, without scaling and thus the layout pattern of the mask is produced as an layout pattern on the wafer.

Figure 5A:
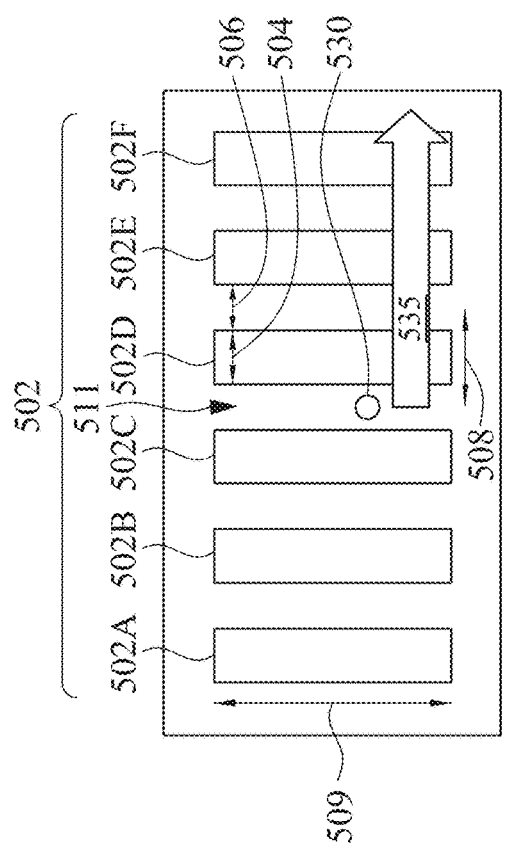
FIG. 5A shows a top view of a layout pattern on a mask having a defect.

FIG. 5A shows a layout pattern on a mask having a defect in accordance with some embodiments of the present disclosure. FIG. 5A shows a layout pattern 502 on a mask. In some embodiments, the layout pattern 502 includes six or more rectangles or boxes. The rectangle 502A, 502B, 502C, 502D, 502E, and 502F are equally spaced having a space-width 506 between each two adjacent rectangles. Each one of the rectangles 502A, 502B, 502C. 502D. 502E, and 502F have a same width 504 and a same height 509. In some embodiments, the rectangles are connection lines. In some embodiments, the rectangles are designated locations for implementing elements, e.g., transistors, of a circuit. In some embodiments, the space-width 506 is about 17.5 nm and the width 504 of each rectangle 502A, 502B, 502C. 502D. 502E, and 502F is about 17.5 nm. Thus, a distance 508 between a midpoint of a space between the rectangles 502C and 502D to the midpoint of the next space between the rectangles 502D and 502E is about 35 nm. In some embodiments, the space-width 506 is about 17 nm and the width 504 of each rectangle 502A, 502B, 502C. 502D. 502E, and 502F is about 18 nm. Thus, the distance 508 between each two neighboring spaces is about 35 nm. These dimensions are selected for the purpose of simulation as set forth below.

Figure 5B:
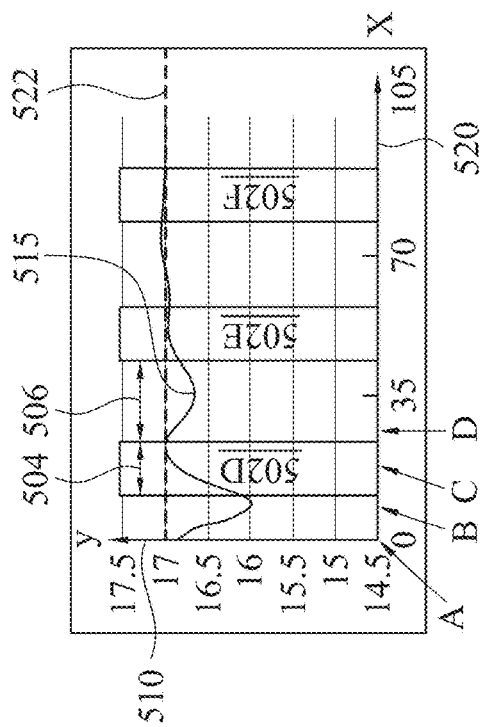
FIGS. 5B and 5C show graphs of the critical dimension of the projected layout pattern of FIG. 5A on a wafer when the defect location changes.
Figure 5C:
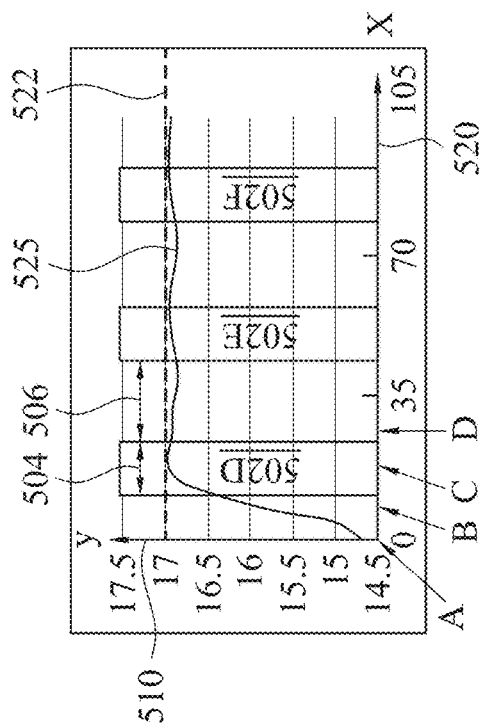

In some embodiments, the mask of FIG. 5A includes a defect 530, a pit or a bump consistent with the defect of FIG. 4, that is between the rectangles 502C and 502D. In some embodiments, the defect 530 is at a center of the space 511 between the rectangles 502C and 502D and the space 511 has the space-width 506. In some embodiments, the defect 530, a bump or a pit, affects. e.g., reduces, the CD value of the space 511 between the rectangles 502C and 502D. The effect of the defect 530 on the CD value of the space 511 is shown in FIGS. 5B and 5C. In some embodiments, the defect 530 moves in a direction 535 starting from the midpoint of the space 511 between the rectangles 502C and 502D. The defect 530 passes through the rectangle 502D, passes through the space between the rectangles 502D and 502E, and passes through the rectangle 502E. Then, the defect 530 passes through the space between the rectangles 502E and 502F and passes through the rectangle 502F. FIGS. 5B and 5C show the effect of the defect 530, as moving in the direction 535, on the CD value of the space 511 between the rectangles 502C and 502D of the mask.

FIGS. 5B and 5C show graphs 515 and 525 of the critical dimension of the projected layout pattern of FIG. 5A on a wafer when the defect location changes in accordance with some embodiments of the present disclosure. In FIGS. 5B and 5C, the y-coordinate 510 shows a width of space 511 and the x-coordinate 520 shows the defect location. The origin of the x-coordinate 520 is the center of the space 511 between the rectangles 502C and 502D, where the defect 530 is originally located as shown in FIG. 5A (or FIG. 6A). Graphs 515 and 525 of FIGS. 5B and 5C show the width of the space 511 between the rectangles 502C and 502D when the defect 530 moves along the direction 535. In some embodiments, the width of the space 511. e.g., a CD value of the space 511, is displayed on the y-coordinate 510. In some embodiments, the width of the space 511 is determined by a simulation. The simulation assumes that the defect 530 is originally at a midpoint between rectangles 502C and 502D and then it is assumed that the location of the defect 530 changes along the direction 535 of FIG. 5A (see also, FIGS. 6A, 6B, 6C, and 6D). FIGS. 5B and 5C also reproduce a portion of FIG. 5A that include the rectangles 502D, 502E, and 502F and have the same width 504 for the rectangles and have the same space-width 506 for the space between neighboring rectangles of FIG. 5A.

In the graph 515, the defect 530 is a bump with a maximum height of 0.175 nm and the FWHM extent of 12 nm. The CD value of the space 511 between the rectangles 502C and 502D with no defect is 17 nm (as shown by line 522), in some embodiments. The location of the defect 530, defined as the center of the defect 530 (consistent with the center 415 of FIG. 4), begins from the center of the space 511 between the rectangles 502C and 502D, which is the origin where the value of the x-coordinate 520 is zero. Thus, as shown in FIG. 5B, when the bump, e.g., the defect 530, is at the origin, the CD value of the space 511 between the rectangles 502C and 502D is about 16.8 nm and the CD value decreases to 16.0 nm when the defect 530 is located close to the rectangle 502D. Also, the CD value of the space 511 between the rectangles 502C and 502D is essentially unaffected by the defect 530 when the bump gets close to the center of the rectangle 502D where the defect 530 is essentially covered by the rectangle 502D. In addition, the CD value of the space 511 between the rectangles 502C and 502D is slightly modified by the defect 530 to a minimum at 16.7 nm when the bump is located in the space between the rectangles 502D and 502E. Again, the CD value of the space 511 between the rectangles 502C and 502D is essentially unaffected by the defect 530 when the bump gets close to the center of the rectangle 502E where the defect 530 is essentially covered by the rectangle 502E. Also, the CD value of the space 511 between the rectangles 502C and 502D is essentially unaffected by the defect 530 when the bump gets further away to the space between the rectangles 502E and 502F and gets further away in the 535 direction. As shown by the graph 515, the width of space 511 is not essentially impacted when the bump defect is inside the rectangles such that the rectangles cover the defect.

In the graph 525, the defect 530 is a pit with the maximum depth of 0.175 nm and the FWHM extent of 12 nm. The CD value of the space 511 between the rectangles 502C and 502D with no defect is 17 nm (as shown by line 522), in some embodiments. The location of the defect 530, defined as the center 415 of the defect 530, begins from the center of the space 511 between the rectangles 502C and 502D, which is the origin where the value of the x-coordinate 520 is zero. Thus, as shown in FIG. 5C, when the pit, e.g., the defect 530, is at the origin, the CD value of the space 511 between the rectangles 502C and 502D is about 14.8 nm and the CD value increases to 16.5 nm when the defect 530 is located next to the rectangle 502D. Also, the CD value of the space 511 between the rectangles 502C and 502D is essentially unaffected by the defect 530 when the pit gets close to the center of the rectangle 502D where the defect 530 is essentially covered by the rectangle 502D. In addition, the CD value of the space 511 between the rectangles 502C and 502D is slightly modified by the defect 530 to a minimum at 16.7 nm when the pit is located in the space between the rectangles 502D and 502E. Again, the CD value of the space 511 between the rectangles 502C and 502D is essentially unaffected by the defect 530 when the pit gets close to the center of the rectangle 502E where the defect 530 is essentially covered by the rectangle 502E. Also, the CD value of the space 511 between the rectangles 502C and 502D is essentially unaffected by the defect 530 when the pit gets further away to the space between the rectangles 502E and 502F and moves further away. As shown by the graph 525, the width of space 511 is not essentially impacted when the pit defect is inside the rectangles such that the rectangles cover the defect.

As shown in FIGS. 5B and 5C, a change in the CD value of the space 511 between the rectangles 502C and 502D is stronger for the pit than the bump when the defect 530 is located in the space 511 between the rectangles 502C and 502D. However, the effect of the bump on the CD value of a space is more stretched out than the pit. In some embodiments, a bump may affect the CD value of a space when the bump is located in a neighboring space. In addition. FIGS. 5B and 5C show locations A. B. C, and D of the defect 530 in or around the rectangle 502D. The locations A, B, C, and D of the defect 530 are described with respect to FIGS. 6A, 6B, 6C, and 6D.

Figure 6A:
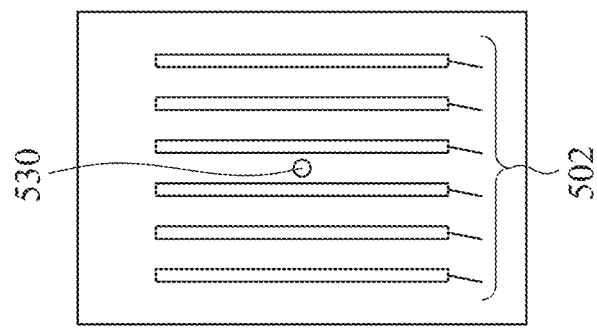
FIGS. 6A, 6B, 6C, and 6D show a layout pattern on a mask that has a defect at different locations in accordance with some embodiments of the present disclosure.
Figure 6B:
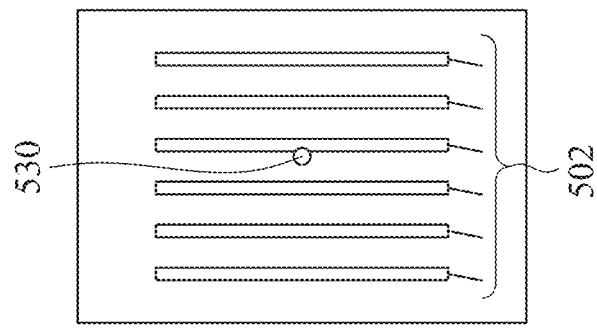
Figure 6C:
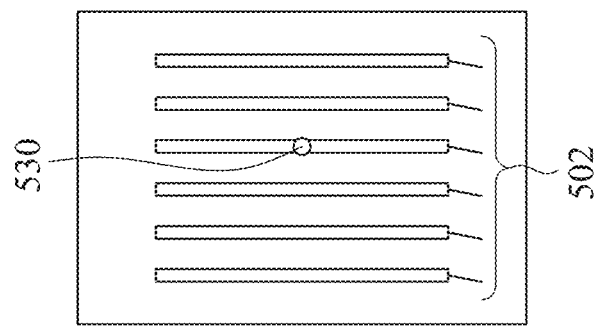
Figure 6D:
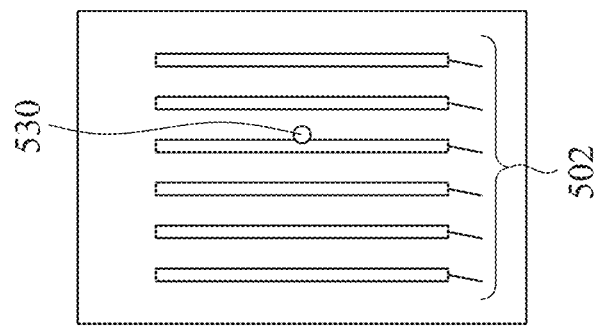

FIGS. 6A, 6B. 6C, and 6D show a layout pattern on a mask that has a defect at different locations in accordance with some embodiments of the present disclosure. FIGS. 6A, 6B, 6C, and 6D include the layout pattern 502 that includes the rectangles 502A, 502B, 502C, 502D, 502E, and 502F that are equally spaced with a space having a space-width 506 between each two adjacent rectangles. FIG. 6A shows the center 415 of the defect 530 at the center of the space 511 between the rectangles 502C and 502D, which is consistent with the location A of FIGS. 5B and 5C that is the origin of the x-coordinate 520. FIG. 6B shows the center 415 of the defect 530 in the space 511 between the rectangles 502C and 502D and close to the rectangle 502D in the space 511, which is consistent with the location B of FIGS. 5B and 5C. FIG. 6C shows the center 415 of the defect 530 inside the rectangle 502D and at the center of the rectangle 502D, which is consistent with the location C of FIGS. 5B and 5C. FIG. 6D shows the center 415 of the defect 530 in the space between the rectangles 502D and 502E and close to the rectangle 502D, which is consistent with the location D of FIGS. 5B and 5C. As shown in FIG. 5B, when the defect 530 is a bump, the CD value of the space 511 is the most impacted when the bump is at the location shown in FIG. 6B. However, when the defect 530 is a pit, the CD value of the space 511 is the most impacted when the pit is at the location shown in FIG. 6A.

Figure 7A:
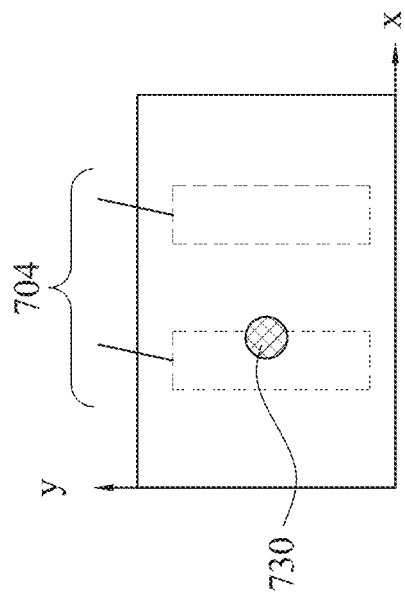
FIGS. 7A, 7B, 7C, and 7D respectively show a critical feature of an (initial) layout pattern of a photo mask to be produced on a wafer, a mask-blank having a defect with a location relative to the critical feature of the layout pattern, an optical proximity corrected layout pattern produced on the mask-blank having the defect, and a photo resist pattern produced on the wafer using a photo mask having the layout pattern of FIG. 7C in accordance with some embodiments of the present disclosure.
Figure 7B:
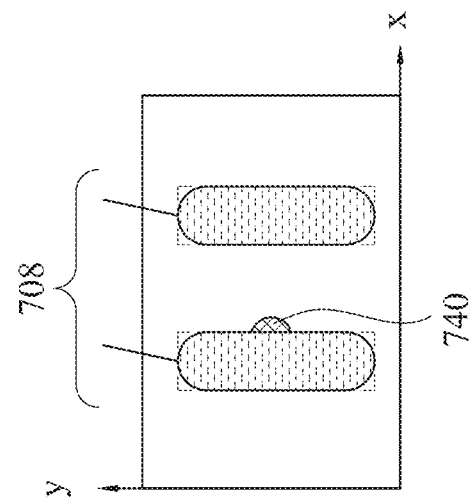
Figure 7C:
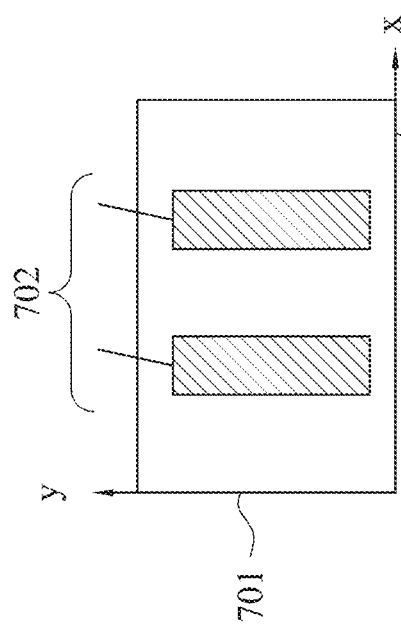

FIGS. 7A, 7B, 7C, and 7D respectively show a critical feature of an (initial) layout pattern of a photo mask to be produced on a wafer, a mask-blank having a defect with a location relative to the critical feature of the layout pattern, an optical proximity corrected layout pattern produced on a mask-blank having the defect, and a photo resist pattern produced on the wafer using a photo mask having the layout pattern of FIG. 7C in accordance with some embodiments of the present disclosure. In some embodiments, FIG. 7A shows the initial layout pattern 702 that is intended to be produced on the wafer and includes two rectangles extending in the y-direction 701 and arranged in the x-direction 703 consistent with the rectangles of FIG. 5A.

Figure 7D:
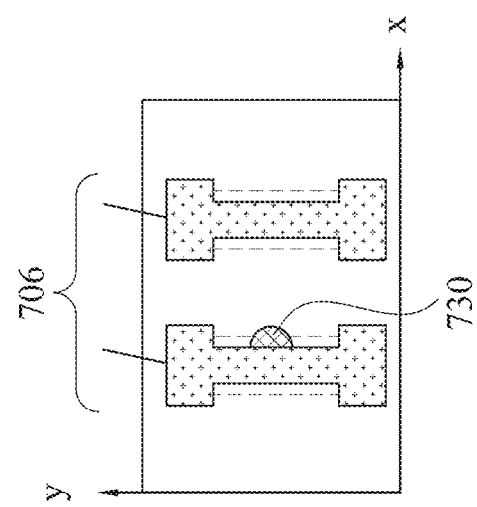

FIG. 7B shows a defect on a mask-blank with a relative locations to the layout pattern 704 (the same as the initial layout pattern 702) on the mask. The mask of FIG. 7B includes a defect 730 that is consistent with the defect 530 of FIG. 5A. In some embodiments, due to an optical proximity effect, transferring sufficiently the same pattern of the mask layout to the wafer is a major challenge in semiconductor manufacturing. An optical proximity correction (OPC) operation may be applied to mitigate the optical proximity effects. The OPC is used to achieve images close to the target circuit patterns, to optimize the printing parameters such as the illumination source, or optimize the source and the photo mask to achieve better printability. FIG. 7C shows an OPC enhanced layout pattern 706 on the mask. FIG. 7D shows a photo resist layout pattern 708 that is produced on the wafer by the OPC enhanced layout pattern 706 of the mask. As shown, the defect 730 of the mask creates a defect 740 in the photo resist layout pattern 708 of the wafer. In some embodiments, the defect 740 modifies, e.g., reduces, the CD value of a space between neighboring rectangles of the produced photo resist layout pattern 708 on the wafer. As discussed, the defect 730 is a defect of the mask and thus is not part of the OPC enhanced layout pattern 706 of the mask, however, the defect 740 is produced on the wafer and thus the defect 740 is part of the photo resist layout pattern 708 on the wafer. In other embodiments, when the size or dimension of the defect 740 is sufficiently small, the photo resist layout pattern 708 is acceptable and a subsequent patterning operation (e.g., dry etching) is performed with the photo resist layout pattern 708.

Figure 8A:
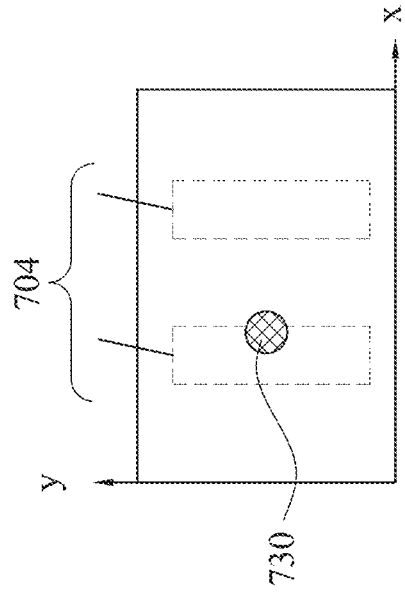
FIGS. 8A, 8B, 8C, and 8D respectively show a critical feature of an (initial) layout pattern of a photo mask to be produced on a wafer, a mask-blank having a defect with a location relative to the critical feature of the layout pattern, an optical proximity corrected and adjusted layout pattern produced on the mask-blank having the defect, and a photo resist pattern produced on the wafer using a photo mask having the layout pattern of FIG. 8C in accordance with some embodiments of the present disclosure.
Figure 8B:
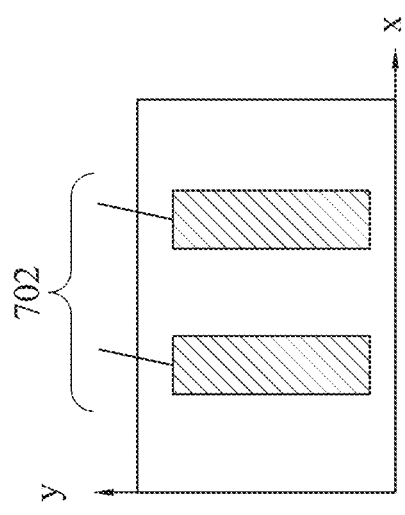
Figure 8C:
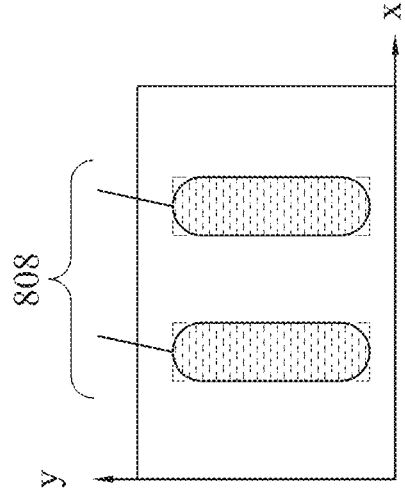

FIGS. 8A, 8B, 8C, and 8D respectively show a critical feature of an (initial) layout pattern of a photo mask to be produced on a wafer, a mask-blank having a defect with a location relative to the critical feature of the layout pattern, an optical proximity corrected and adjusted layout pattern produced on the mask-blank having the defect, and a photo resist pattern produced on the wafer using a photo mask having the layout pattern of FIG. 8C in accordance with some embodiments of the present disclosure. In some embodiments, FIG. 8A shows the initial layout pattern 702 on the mask that is intended to be produced on the wafer by projecting the mask on the wafer. In some embodiments, the mask of FIG. 8B includes the defect 730.

Figure 8D:
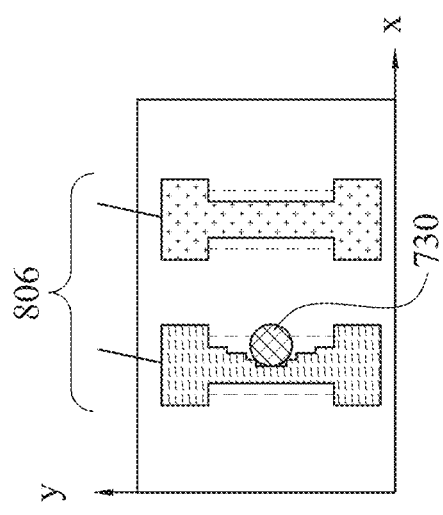

FIG. 8B shows the layout pattern 704 that is the same as layout pattern 702 and the defect 730 on the mask. FIG. 8C shows a layout pattern 806 on the mask designed to produce the initial layout pattern 702 on the photo resist. As shown, the layout pattern 806 includes the OPC enhancements that are consistent with the enhancements of the layout pattern 706 of FIG. 7C. In addition to the OPC enhancements, the layout pattern 806 is adjusted, e.g., corrected or revised, based on the defect 730, to suppress the effect of defect 730 in a photo resist pattern 808 that is produced by projecting the mask on the wafer. In some embodiments, the additional adjustments to the layout pattern 806 removes or suppresses the defect 740 that is produced in the photo resist layout pattern 708 of FIG. 7D. FIG. 8D shows the photo resist pattern 808 that is produced on the wafer after the OPC enhancements and the additional adjustment of the layout pattern 806 of the mask. As shown, the defect 730 of the mask does not create a defect in the photo resist pattern 808 of the wafer. Thus, the defect 730 of the mask does not change the CD of the space between neighboring rectangles of the produced photo resist pattern 808. In some embodiments, the layout pattern 806 is produced by adjusting the OPC enhanced layout pattern 706, e.g., by removing portions of the OPC enhanced layout pattern 706 near the defect 730, such that the combination of the layout pattern 806 and the defect 730 produce the photo resist pattern 808, which is similar to the intended initial layout pattern 702, and the photo resist pattern 808 does not have the defect 740 of FIG. 7D.

Figure 9A:
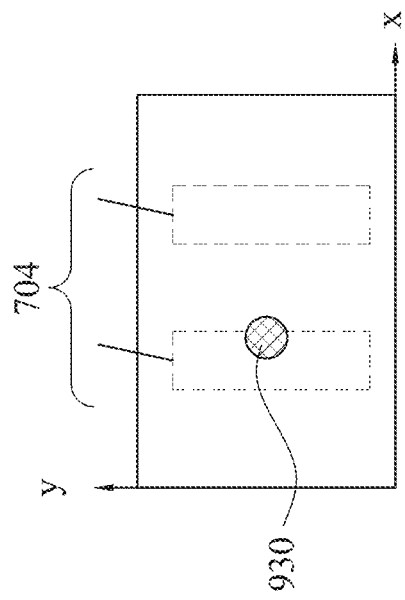
FIGS. 9A, 9B, 9C, and 9D respectively show a critical feature of an (initial) layout pattern of a photo mask to be produced on a wafer, a mask-blank having a defect larger than the defect of FIG. 7B with a location relative to the critical feature of the layout pattern, an optical proximity corrected layout pattern produced on the mask-blank having the defect, and a photo resist pattern produced on the wafer using a photo mask having the layout pattern of FIG. 9C in accordance with some embodiments of the present disclosure.
Figure 9B:
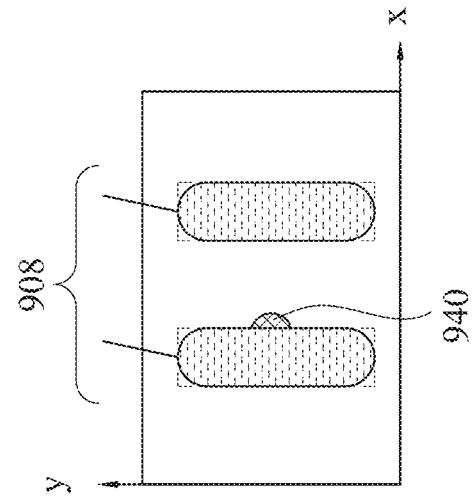
Figure 9C:
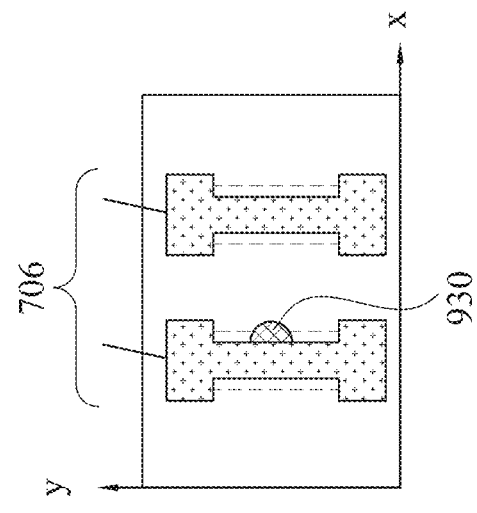

FIGS. 9A, 9B, 9C, and 9D respectively show a critical feature of an (initial) layout pattern of a photo mask to be produced on a wafer, a mask-blank having a defect larger than the defect of FIG. 7B with a location relative to the critical feature of the layout pattern, an optical proximity corrected layout pattern produced on the mask-blank having the defect, and a photo resist pattern produced on the wafer using a photo mask having the layout pattern of FIG. 9C in accordance with some embodiments of the present disclosure. In some embodiments, FIG. 9A shows the initial layout pattern 702 on the mask that is intended to be produced on the wafer by projecting a mask on the wafer. In some embodiments, the mask of FIG. 9B includes a defect 930, which is larger than the defect 730 of FIGS. 7B and 8B.

Figure 9D:
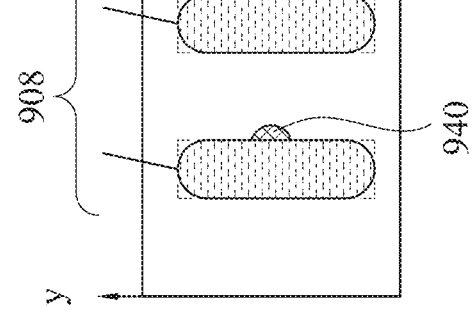

FIG. 9B shows the layout pattern 704 and the defect 930 on the mask. FIG. 9C shows the OPC enhanced layout pattern 706 on the mask designed to produce the initial layout pattern 702 on the photo resist of the wafer. FIG. 9D shows the photo resist layout pattern 908 that is produced on the wafer by the OPC enhanced layout pattern 706 of the mask. As shown, the defect 930 of the mask creates a defect 940 in the photo resist layout pattern 908 of the wafer. In some embodiments, the defect 940 modifies. e.g., reduces, the CD of a space between neighboring rectangles of the produced photo resist layout pattern 908. In some embodiments, when the size or dimension of the defect 940 is greater than the threshold dimension, the photo resist layout pattern 908 is not acceptable.

Figure 10B:
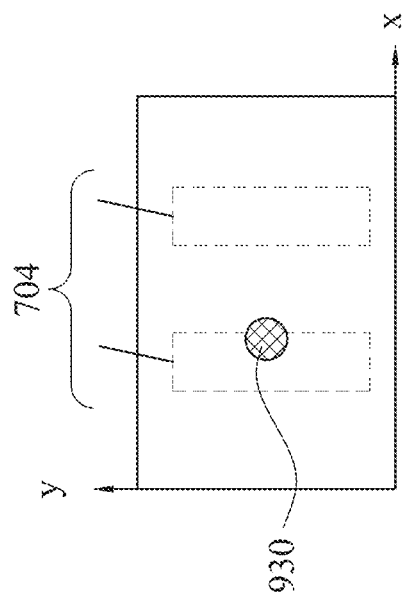
FIGS. 10A, 10B, 10C, and 10D respectively show a critical feature of an (initial) layout pattern of a photo mask to be produced on a wafer, a mask-blank having a defect larger than the defect of FIG. 8B with a location relative to the critical feature of the layout pattern, an optical proximity corrected and adjusted layout pattern produced on the mask-blank having the defect, and a photo resist pattern produced on the wafer using a photo mask having the layout pattern of FIG. 10C in accordance with some embodiments of the present disclosure.
Figure 10D:
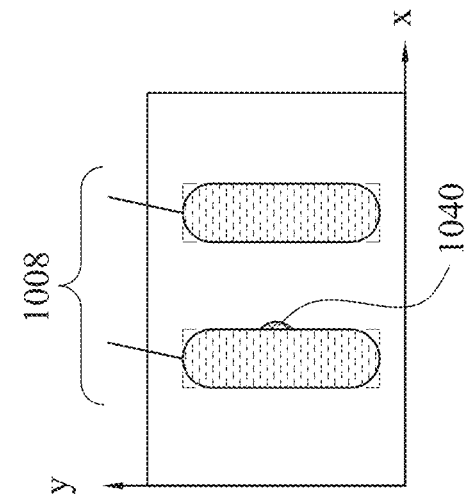
Figure 10A:
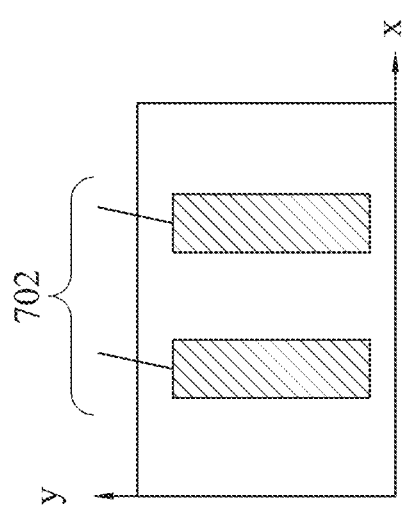
Figure 10C:
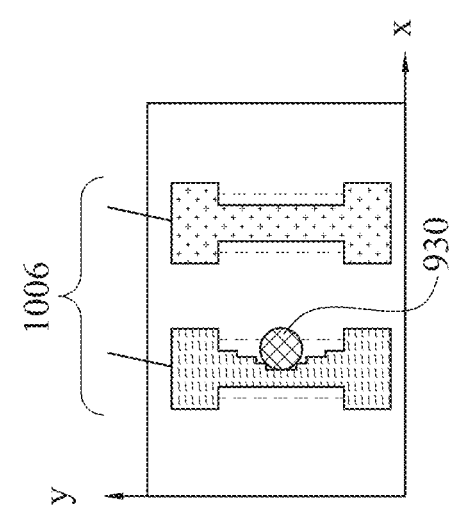

FIGS. 10A, 10B, 10C, and 10D respectively show a critical feature of an (initial) layout pattern of a photo mask to be produced on a wafer, a mask-blank having a defect larger than the defect of FIG. 8B with a location relative to the critical feature of the layout pattern, an optical proximity corrected and adjusted layout pattern produced on the mask-blank having the defect, and a photo resist pattern produced on the wafer using a photo mask having the layout pattern of FIG. 10C in accordance with some embodiments of the present disclosure. FIG. 10A shows the initial layout pattern 702 to be produced on the wafer by projecting the mask on the wafer. In some embodiments, the mask of FIG. 10B includes a defect 930.

FIG. 10B shows the layout pattern 704 that is the same as layout pattern 702 and the defect 930 on the mask. FIG. 10C shows a layout pattern 1006 on the mask designed to produce the initial layout pattern 702 on the photo resist of the wafer. As shown, the layout pattern 1006 includes the OPC enhancements that are consistent with the enhancements of the layout pattern 706 of FIG. 7C. In addition to the OPC enhancements, the layout pattern 806 is adjusted, e.g., corrected, based on the defect 930, to reduce the effect of defect 930 in a photo resist layout pattern 1008 that is produced by projecting the mask on the wafer. FIG. 10D shows the photo resist layout pattern 1008 that is produced on the wafer after the OPC enhancement and the additional adjustment of the layout pattern 1006 of the mask. As shown, the defect 930 of the mask creates a defect 1040 in the photo resist layout pattern 1008 of the wafer, which is smaller than the defect 940 of FIG. 9D. Thus, the effect of the defect 930 of the mask, although is not completely removed, it is reduced. Additionally, the defect 930 of the mask changes the CD of the space between neighboring rectangles of the produced photo resist layout pattern 1008 on the wafer, however, the CD change is smaller than the CD change in FIG. 9D. Similar to FIG. 8C, the layout pattern 1006 is produced by adjusting the OPC enhanced layout pattern 706, e.g., by removing portions of the OPC enhanced layout pattern 706 near the defect 930, to reduce the effects of the defect 930 on the photo resist layout pattern 1008 of the wafer. In some embodiments, when the size or dimension of the defect 1040 is sufficiently small, the photo resist layout pattern 1008 is acceptable and the subsequent patterning operation (e.g., dry etching) is performed with the resist layout pattern 1008.

FIGS. 11A, 11B, 11C, and 11D respectively show a critical feature of an (initial) layout pattern of a photo mask to be produced on a wafer, a mask-blank having a defect larger than the defect of FIG. 7B with a location away from the critical feature of the layout pattern, an optical proximity corrected layout pattern produced on the mask-blank having the defect, and a photo resist pattern produced on the wafer using a photo mask having the layout pattern of FIG. 1C in accordance with some embodiments of the present disclosure. In some embodiments, FIG. 1A shows the initial layout pattern 702 on the mask that is intended to be produced on the wafer by projecting the mask on the wafer. In some embodiments, the mask of FIG. 11B includes a defect 1130.

Figure 11B:
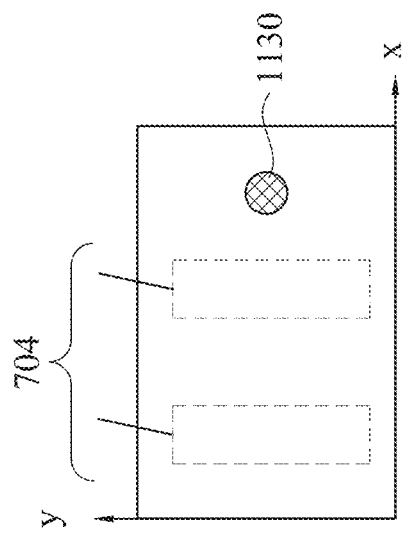
FIGS. 11A, 11B, 11C, and 11D respectively show a critical feature of an (initial) layout pattern of a photo mask to be produced on a wafer, a mask-blank having a defect larger than the defect of FIG. 7B with a location away from the critical feature of the layout pattern, an optical proximity corrected layout pattern produced on the mask-blank having the defect, and a photo resist pattern produced on the wafer using a photo mask having the layout pattern of FIG. 11C in accordance with some embodiments of the present disclosure.
Figure 11D:
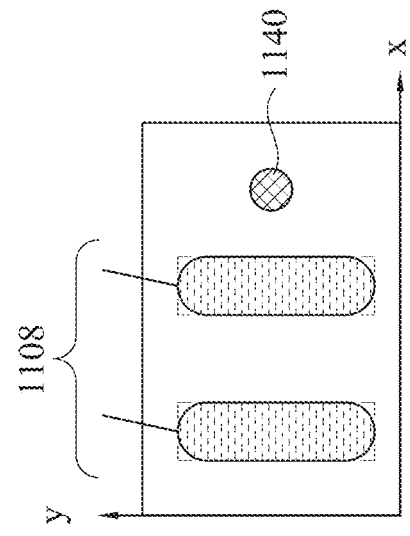
Figure 11A:
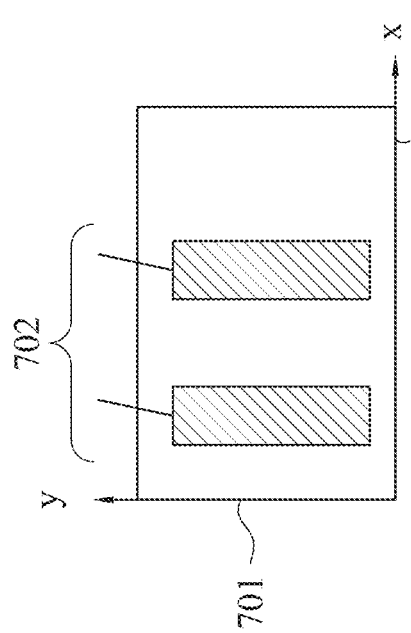
Figure 11C:
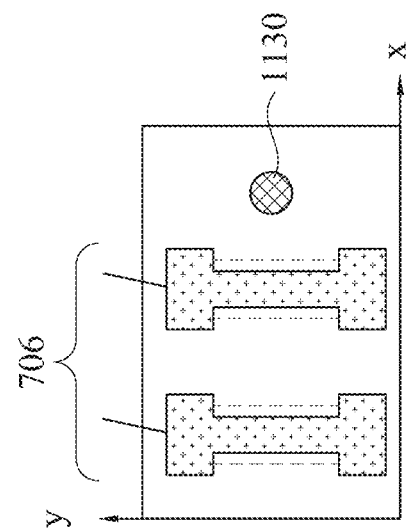

FIG. 11B shows the layout pattern 704 and the defect 1130 on the mask. As shown, the defect 1130 of FIG. 11B, unlike the defects in FIGS. 7B, 8B, 9B, and 10B, is not in contact with the layout pattern 704 of the mask. FIG. 11C shows the OPC enhanced layout pattern 706 on the mask designed to produce the initial layout pattern 702 on the photo resist of the wafer. FIG. 11D shows a photo resist layout pattern 1108 that is produced on the wafer by the OPC enhanced layout pattern 706 of the mask. As shown, the defect 1130 of the mask creates a defect 1140 in the photo resist layout pattern 1108 of the wafer. In some embodiments, although the defect 1140 does not modify the CD of a space between neighboring rectangles of the produced photo resist layout pattern 1108, the defect 1140 is too close to the photo resist layout pattern 1108 of the wafer that can interfere with the photo resist layout pattern 1108 in the next IC fabrication process steps.

Figure 12A:
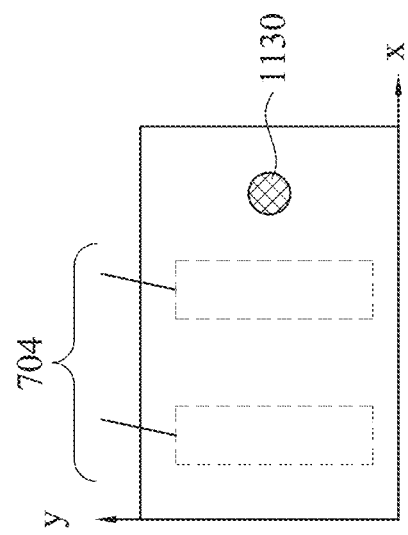
FIGS. 12A, 12B, 12C, and 12D respectively show a critical feature of an (initial) layout pattern of a photo mask to be produced on a wafer a mask-blank having the defect of FIG. 11B, an optical proximity corrected and adjusted layout pattern produced on the mask-blank having the defect, and a photo resist pattern produced on the wafer using a photo mask having the layout pattern of FIG. 12C in accordance with some embodiments of the present disclosure.
Figure 12B:
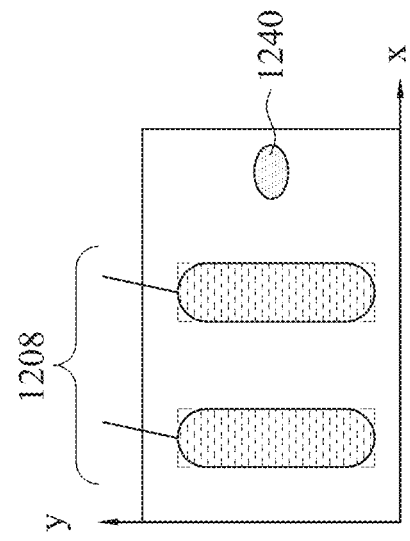
Figure 12C:
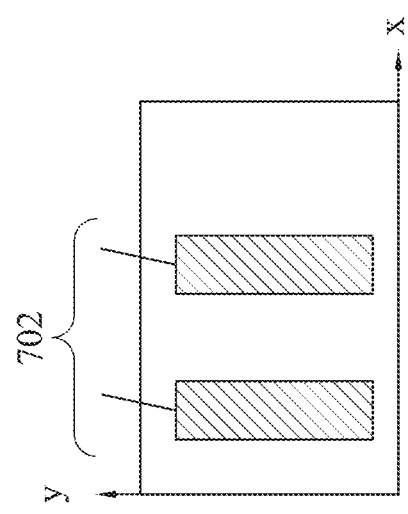

FIGS. 12A, 12B, 12C, and 12D respectively show critical feature of an (initial) layout pattern of a photo mask to be produced on a wafer, a mask-blank having the defect of FIG. 11B, an optical proximity corrected and adjusted layout pattern produced on the mask-blank having the defect, and a photo resist pattern produced on the wafer using a photo mask having the layout pattern of FIG. 12C in accordance with some embodiments of the present disclosure. FIG. 12A shows the initial layout pattern 702 to be produced on the wafer by projecting the mask on the wafer. In some embodiments, the mask of FIG. 12B includes the defect 1130.

Figure 12D:
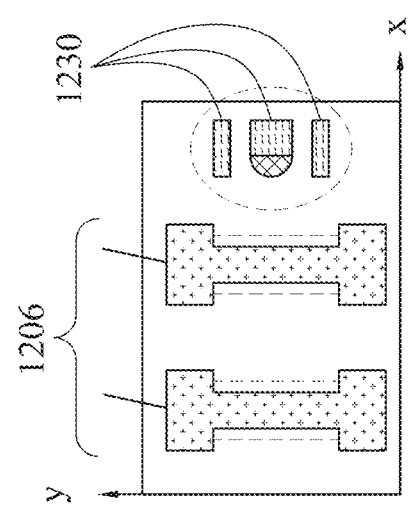

FIG. 12B shows the layout pattern 704 and the defect 1130 on the mask. As shown, the defect 1130 of FIG. 12B is not in contact with the layout pattern 704 of the mask. FIG. 12C shows that the layout pattern 1206 includes the OPC enhancements that are consistent with the enhancements of the layout pattern 706 of FIG. 7C to produce the initial layout pattern 702 on the wafer. In addition to the OPC enhancements, the layout pattern 1206 on the mask is adjusted, based on the defect 1130, to move the effect of the defect 1130 on the photo resist pattern further away. As shown, the layout pattern of the mask additionally includes mask enhancement segments 1230, created based on the defect 1130. The mask enhancement segments 1230 are one or more additional patterns that are produced on the mask to move the effects of the defect 1130 further away from the initial layout pattern 702. Thus, as shown in FIGS. 11D and 12D, a defect 1240 of photo resist pattern 1208 of FIG. 12D on the wafer is further away from the intended layout pattern (the initial layout pattern 702) compared to the defect 1140 of the photo resist layout pattern 1108 of FIG. 11D. In some embodiments, the mask enhancement segments 1230 may induce different phase shifts when projected on the wafer to move the defect 1240 further away from the rectangles.

Figure 13:
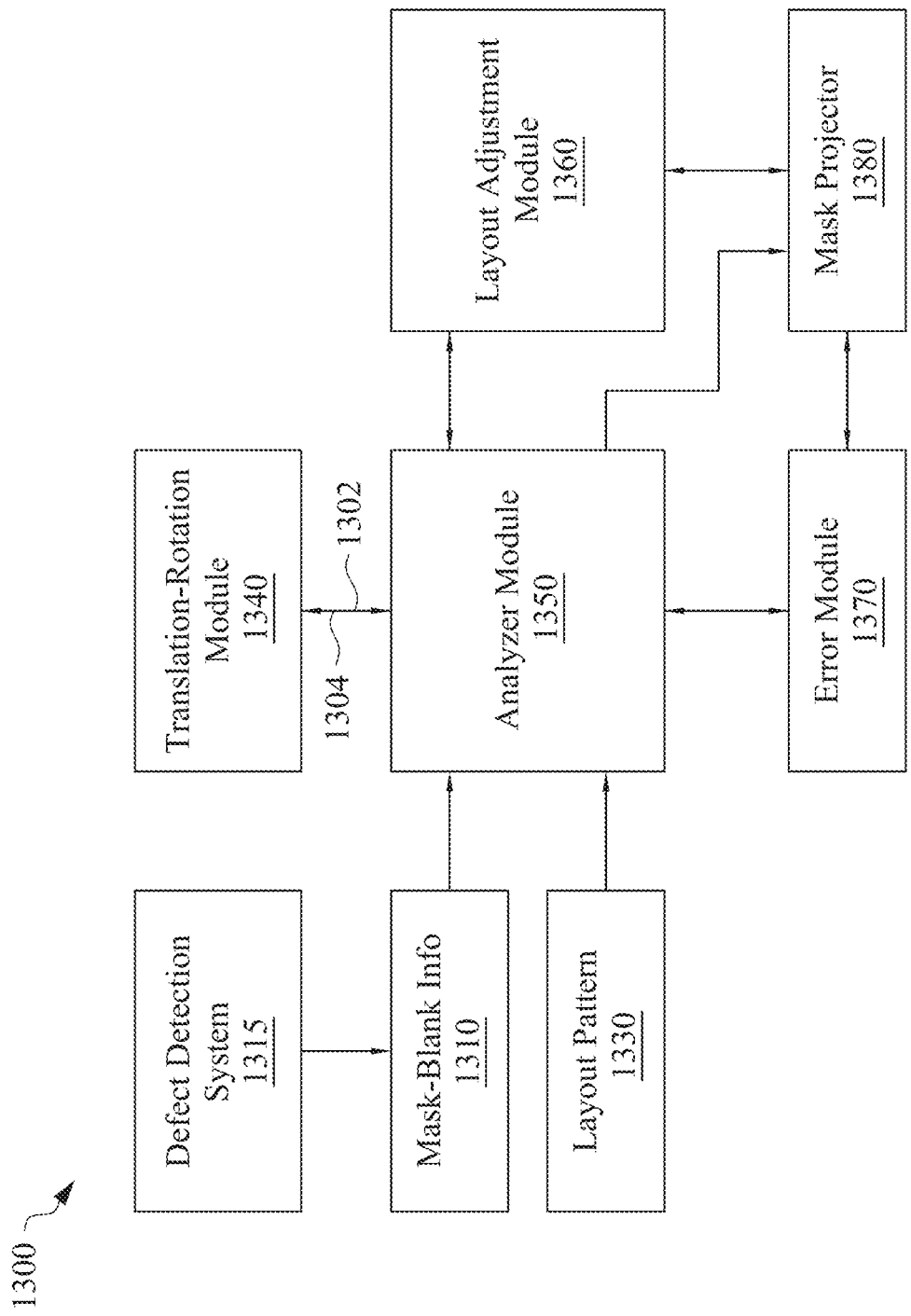
FIG. 13 shows a control system for analyzing and adjusting the layout pattern for manufacturing a photo mask in accordance with some embodiments of the present disclosure.

FIG. 13 shows a control system 1300 for determining a measureable acceptance criterion of a layout pattern when projected based on a layout pattern of a mask to a wafer and analyzing and adjusting the layout pattern of the mask, in accordance with some embodiments of the present disclosure. The control system 1300 includes an analyzer module 1350 and a translation-rotation module 1340 coupled to each other. The analyzer module 1350 determines if the critical features of the layout pattern of the mask land on defects of the mask-blank and controls the adjustments to the layout pattern of the mask. The translation-rotation module 1340 determines the amounts of the rotation and translation. e.g., movement along a length or a width directions, of the layout pattern of the mask to avoid the impact of one or more defects of the mask-blank. The control system 1300 also includes a layout adjustment module 1360 coupled to the analyzer module 1350. In some embodiments, the layout adjustment module 1360 modifies the pattern, e.g., geometric shapes, of the layout pattern of the mask to avoid or minimize the impact of one or more defects. The control system 1300 also includes a mask projector 1380 coupled to the layout adjustment module 1360 and the analyzer module 1350 that determines a projected layout pattern that is produced by projecting the layout pattern of the mask on a wafer. The control system 1300 also includes an error module 1370 coupled to the mask projector 1380 and the analyzer module 1350 to determine an error based on the impact of the defects on the projected layout pattern on the wafer. In some embodiments, the analyzer module 1350 performs an inspection of the mask-blank to determine the defects.

The analyzer module 1350 receives information about a mask-blank or mask-blank info 1310. The mask-blank is used for creating the mask and the mask-blank info 1310 includes coordinates of the defects of the mask-blank and the size of the mask-blank. In some embodiments, the mask-blank info 1310 is received from a manufacturer of the mask-blank. In some embodiments, the mask-blank info 1310 is received from a defect detection system 1315. The defect detection system 1315 may examine. e.g., inspect, the mask-blank to find the coordinates of the defects and the size of the mask-blank. The analyzer module 1350 also receives a layout pattern 1330 of the mask, which will be created on the mask-blank. In some embodiments, the coordinates of the defects are determined based on a reference point and reference coordinates of the mask-blank. In some embodiments the reference point is a center or a bottom-left corner of the mask-blank and the reference coordinates are the along the length and the width in the y-direction and x-direction respectively as shown if FIGS. 7A, 7B, 7C, and 7D.

In some embodiments, the analyzer module 1350 determines that if the layout pattern 1330 is produced on the mask-blank in a predefined position, e.g., centered without rotation, the critical features of the layout pattern of the mask land on or near one or more defects of the mask-blank.

In some embodiments, the determination is based on the mask-blank info 1310 and the layout pattern 1330. Based on the determination, the analyzer module 1350 sends the mask-blank info 1310 and the layout pattern 1330 to the translation-rotation module 1340 to determine a translation direction-and-amount 1302 and a rotation direction-and-amount 1304 for the layout pattern 1330 of the mask. In some embodiments, the translation direction-and-amount 1302 includes translation amounts, e.g., in nm, and translation directions, positive or negative, along the reference coordinates. In some embodiments, the rotation direction-and-amount 1304 includes an amount, e.g., in degrees, and a direction clockwise or counterclockwise rotation about the reference point of the mask-blank.

In some embodiments, the translation-rotation module 1340 determines the translation direction-and-amount 1302 and the rotation direction-and-amount 1304 such that the critical features of the layout pattern of the mask, after translation and/or rotation, avoid landing on one or more of the defects and do not land on any new defect. In some embodiments, the translation-rotation module 1340 determines the translation direction-and-amount 1302 and the rotation direction-and-amount 1304 such that after the translation and rotation the critical features of the layout pattern of the mask lands on a fewer number of defects, e.g., five defects are avoided but the critical features of the layout pattern of the mask land on two new defects. Thus, the number of defects is reduced by 3.

In some embodiments and as described, after the translation and rotation, the critical features of the layout pattern of the mask land on one or more remaining second defects. In some embodiments, the analyzer module 1350 sends the mask-blank info 1310, the layout pattern 1330 of the mask, the translation direction-and-amount 1302, the rotation direction-and-amount 1304, and the one or more remaining second defects to the layout adjustment module 1360. The layout adjustment module 1360 modifies. e.g., adjusts, the layout pattern 1330 of the mask as described with respect to FIGS. 8C, 10C, and 12C to avoid or minimize the impact of the remaining second defects on the layout pattern that is produced on the wafer. In some embodiments, the layout adjustment module 1360 modifies, e.g., adjusts, the layout pattern 1330 of the mask after the translation and rotation.

In some embodiments, the translated and rotated and then adjusted layout pattern 1330 of the mask is sent to the mask projector 1380. The mask projector 1380 determines, e.g., calculates or measures, a projected layout pattern that is produced by projecting the translated and rotated and then adjusted layout pattern 1330 of the mask on the wafer. In some embodiments, the layout pattern on the wafer is the photo resist layout pattern that is produced by projecting the mask on a photo resist coated wafer. As described with respect to FIG. 10D, the impact of one or more of the remaining second defects on the layout pattern of the wafer remains. Thus, the mask projector 1380 sends the projected layout pattern to the error module 1370 to determine an impact of the defects on the projected layout pattern on the wafer. In some embodiments, the impact of the defects on the projected layout pattern is determined as an impact error. In some embodiments, the acceptance criterion of the layout pattern on the wafer is the impact error and the impact error is a modification, e.g., a reduction, in the CD value of the projected layout pattern on the wafer. In some embodiments, the impact error is defined as a percentage of the CD value reduction. In some embodiments, the acceptance criterion of the layout pattern on the wafer is another impact error, which is an inverse of a distance (e.g., a minimum distance) between a center of a defect, e.g., defect 1140 of FIG. 11D, produced on the wafer to a critical feature, e.g., a rectangle of the photo resist layout pattern 1108. Thus, the impact error is smaller when the defect produced on the wafer is further away from the critical feature. In some embodiments, the acceptance criterion defines a separate impact error for each defect. In some embodiments, the acceptance criterion defines the same impact error for each defect. In some embodiments, the defect is at or near a critical feature of the layout pattern and causes the impact error on that critical feature.

In some embodiments, if the determined impact error is not below a threshold value, a command is sent by the analyzer module 1350 to the layout adjustment module 1360 to apply further adjustment to the layout pattern 1330 of the mask to reduce the impact error. In some embodiments, the threshold value is less than 20 percent and thus if the CD value reduction is not less than 20 percent, the analyzer module 1350 sends a command to the layout adjustment module 1360 to apply further adjustments. In some embodiments, the threshold value is less than 10 percent. In some embodiments, the analyzer module 1350 avoids using the translation-rotation module 1340 before invoking the layout adjustment module 1360 and sends the defects of mask-blank info 1310 to the layout adjustment module 1360 to avoid or minimize the impact of the defects on the layout pattern that is produced on the wafer.

Figure 14:
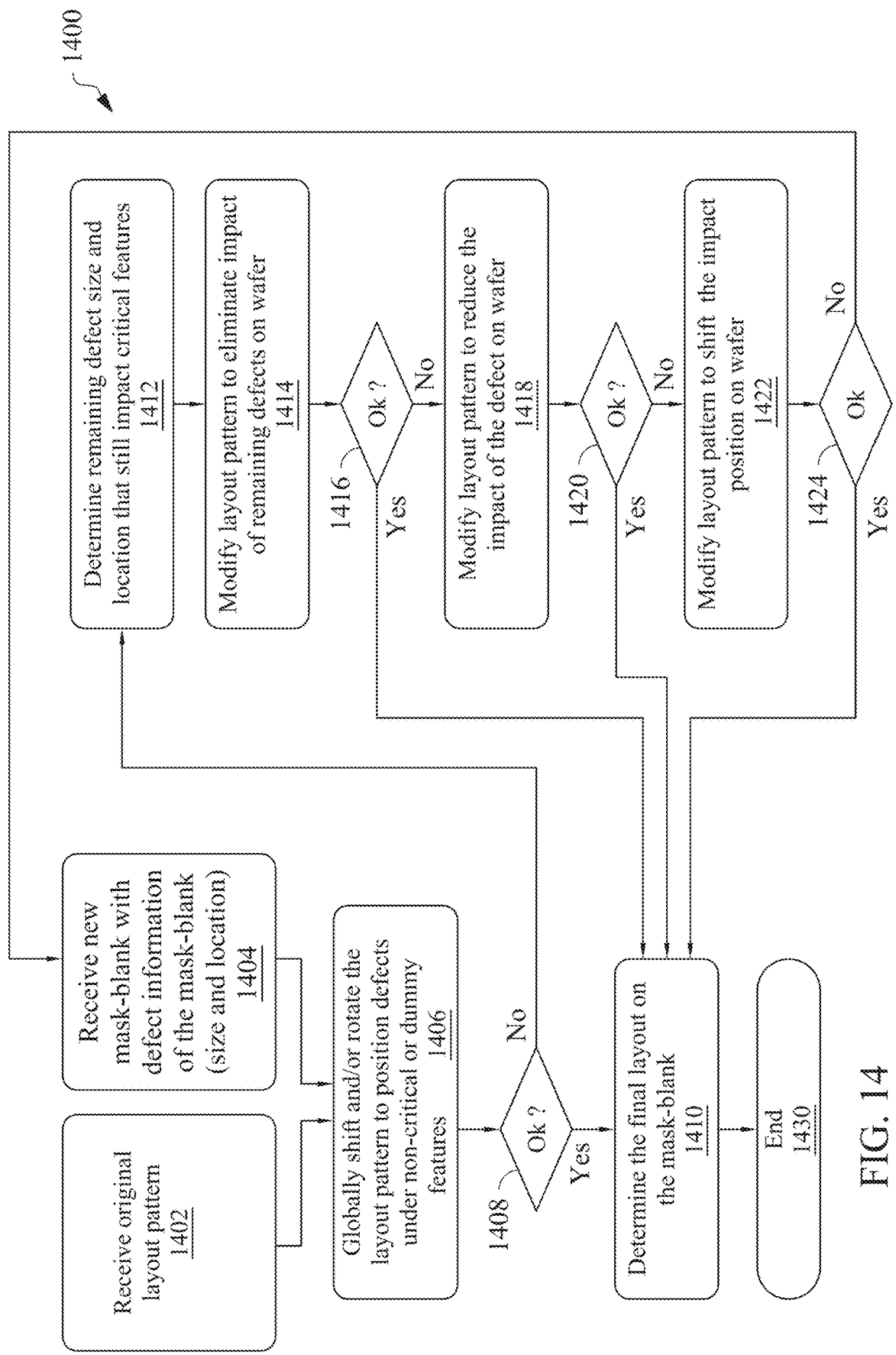
FIG. 14 illustrates a flow diagram of an exemplary process for analyzing and adjusting the layout pattern of a photo mask in accordance with some embodiments of the present disclosure.

FIG. 14 illustrates a flow diagram of an exemplary process 1400 for analyzing and adjusting the layout pattern of a photo mask, in accordance with some embodiments of the present disclosure. In operation 1402, a layout pattern is received and in operation 1404, a new mask-blank with the defect information of the mask-blank are received. The defect information may include the sizes and locations of the defects of the mask-blank. In some embodiments as discussed above with respect to FIG. 13, the mask-blank, the information of the mask-blank. e.g., mask-blank info 1310, and the layout pattern 1330 to be formed on the mask-blank is received by the control system 1300. In some embodiments, the mask-blank info 1310 that includes the sizes and locations of the defects of the mask-blank and the layout pattern 1330 is received by the analyzer module 1350.

In operation 1406, the layout pattern is globally shifted and/or rotated with respect to the mask-blank to position the defects under non-critical or dummy features of the layout pattern. In some embodiments and returning to FIG. 13, the layout pattern 1330 is globally. e.g., entirely, rotated and/or shifted such that a first portion of the defects of the mask-blank are avoided and thus an impact of the first portion of the defects on photo resist layout pattern on the wafer is eliminated. In some embodiments, a defect of the mask-blank is avoided when a non-critical feature or dummy feature of the layout pattern 1330 lands on the defect or when the layout pattern 1330 does not land on the defect. In some embodiments, the translation-rotation module 1340 of the control system 1300 receives, from analyzer module 1350, the layout pattern 1330 and the mask-blank info 1310 that includes the locations of the defects and determines. e.g., calculates, shift and/or rotation amounts for the layout pattern 1330. In some embodiments, after applying the shift and/or rotation amounts to the layout pattern 1330, the first portion of the defects of the mask-blank are avoided by the layout pattern 1330.

In operation 1408, the globally shifted and/or rotated layout pattern 1330 is compared to the locations of the defects of the mask-blank. If it is determined that the entire defects of the mask-blank are avoided by the shifted and/or rotated layout pattern 1330, the operation 1410 is performed, otherwise the operation 1412 is performed. At operation 1410, because the entire defects of the mask-blank are avoided by the shifted and/or rotated layout pattern 1330, the shifted and/or rotated layout pattern 1330 may be determined as the final layout of the mask-blank and may be formed on the mask-blank. The process ends in operation 1430.

At operation 1412, the remaining defect size and location that still impact critical features of the layout pattern are determined. In some embodiments, although the entire defects of the mask-blank are not avoided by the shifted and/or rotated layout pattern 1330, a first portion of defects are determined that are avoided by the shifted and/or rotated layout pattern 1330. Also, a remaining second portion of defects are determined that still impact the critical features of the shifted and/or rotated layout pattern 1330. In some embodiments, one or more critical features of the shifted and/or rotated layout pattern 1330 land on the second portion of defects.

At operation 1414, the shifted and/or rotated layout pattern 1330 is modified to eliminate the impact of the second portion of defects on the wafer. In some embodiments, the layout pattern is locally modified, e.g., locally adjusted, at one or more locations that the critical features land on the second portion of defects such that the geometric shapes of the layout pattern at or near the one or more locations are modified at the one or more locations. In some embodiments, the geometric shape of a critical feature of the layout pattern is modified at a location of the defect such that the combination of the modified layout pattern and the defect at that location produce a photo resist layout pattern on the wafer that is similar to the layout pattern when there is no defect and the geometric shape of the layout pattern is not modified. Thus, the impact of the defect on photo resist layout pattern on the wafer is eliminated. In some embodiments and referring back to FIGS. 7C and 8C, the layout pattern 706 is modified as shown by layout pattern 806.

At operation 1416, it is determined whether the entire second portion of defects are eliminated, e.g., avoided, by modifying the geometric shape of the shifted and/or rotated layout pattern 1330. If it is determined that the entire second portion of defects are eliminated then, the entire defects are avoided and the operation 1410, discussed above, is performed. However, if it is determined that a third portion of defects from the second portion of defects are not eliminated by the operation 1414 and may still impact the critical features of the shifted and/or rotated layout pattern 1330, the operation 1418 is performed.

In some embodiments and referring back to FIG. 13, the mask projector 1380 determines e.g., calculates, a projected layout pattern (e.g., a photo resist layout pattern) that is produced on the wafer by projecting the translated and/or rotated and then adjusted layout pattern 1330 to the wafer. Then the analyzer module 1350 determines, based on the projected layout pattern on the wafer, if the entire second portion of defects are avoided or if the third portion of defects still impact the critical features of the shifted and/or rotated layout pattern 1330.

At operation 1418, the shifted and/or rotated layout pattern 1330 is modified to reduce the impact of the third portion of defects on the wafer. In some embodiments, the layout pattern is locally modified, e.g., locally adjusted, at one or more locations that the critical features land on the third portion of defects such that the geometric shapes of the layout pattern at or near the one or more locations are modified at the one or more locations. In some embodiments, the geometric shape of a critical feature of the layout pattern is modified at a location of the defect such that the combination of the modified layout pattern and the defect at that location produces a photo resist pattern on the wafer that produces less error compared to the layout pattern that was not modified. In some embodiments, the error is a reduction of the CD value of the projected layout pattern on the wafer, e.g. on the photo resist layout pattern on the wafer. In some embodiments and referring back to FIGS. 9C and 10C, the layout pattern 706 is modified as shown by layout pattern 1006.

In some embodiments and referring back to FIG. 13, the mask projector 1380 determines e.g., calculates, a projected photo resist layout pattern that is produced on the wafer by projecting the translated and/or rotated and then adjusted layout pattern 1330 to the wafer. In some embodiments, the error is determined by the error module 1370 that is coupled to the mask projector 1380 and the analyzer module 1350. The error is determined based on the projected photo resist layout pattern that is produced on the wafer. In some embodiments, the error is a percentage of the reduction of the CD value of photo resist layout pattern that is associated with the defect. In some embodiments, the adjustment to the layout pattern is acceptable when the error is below a threshold. In some embodiments, a defect of the third portion of the defects is avoided when the error associated with the defect is below the threshold.

At operation 1420, it is determined whether the entire third portion of defects are avoided by modifying the geometric shape of the shifted and/or rotated layout pattern 1330. If it is determined that the entire third portion of defects are avoided then, the entire defects are avoided and the operation 1410, discussed above, is performed. However, if it is determined that a fourth portion of defects from the third portion of defects are not avoided by the operation 1418 and may still impact the critical features of layout pattern 1330 and cause more error than the threshold, the operation 1422 is performed. In some embodiments, a critical feature of the layout pattern 1330 does not land, at least partially, on a defect of the fourth portion of the defects, however, the critical feature lands near the defect and the defect still impacts the critical feature. Thus, the fourth portion of the defects may not be avoided by the operation 1418.

At operation 1422, the shifted and/or rotated layout pattern 1330 is modified to shift the impact position of the fourth portion of defects on the wafer. In some embodiments, the layout pattern is locally modified, e.g., locally adjusted, at one or more locations of the defects such that the geometric shapes of the layout pattern at or near the one or more locations are modified. In some embodiments, the geometric shape of a critical feature of the layout pattern is modified at a location of the defect such that the combination of the modified layout pattern and the defect at that location produce a photo resist pattern on the wafer where the impact position of the defect is moved further from a critical feature and produces less error compared to the layout pattern that was not modified. In some embodiments and referring back to FIGS. 11C and 12C, the layout pattern at the location of the defect is modified and the mask enhancement segments 1230 are added. As shown in FIG. 12D, the impact portion of the defect 1240 on the photo resist layout pattern is moved further away from the critical feature compared to the impact position of the defect 1140 of FIG. 1D. In some embodiments, the adjustment to the layout pattern is acceptable when the impact position of the defect on the photo resist layout pattern is more than a threshold. In some embodiments, a defect of the fourth portion of the defects is avoided when the impact position is more than the threshold.

At operation 1424, it is determined whether the entire fourth portion of defects are avoided by modifying the geometric shape of the shifted and/or rotated layout pattern 1330. If it is determined that the entire third portion of defects are avoided then, the entire defects are avoided and the operation 1410, discussed above, is performed. However, if it is determined that the entire fourth portion of defects are not avoided, a new mask-blank is selected and process 1400 goes back to operation 1404.

Figure 15A:
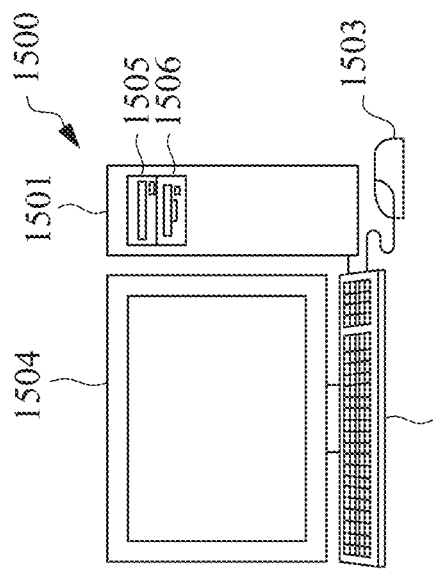
FIGS. 15A and 15B illustrate an apparatus for analyzing and adjusting the layout pattern of a photo mask in accordance with some embodiments of the present disclosure.
Figure 15B:
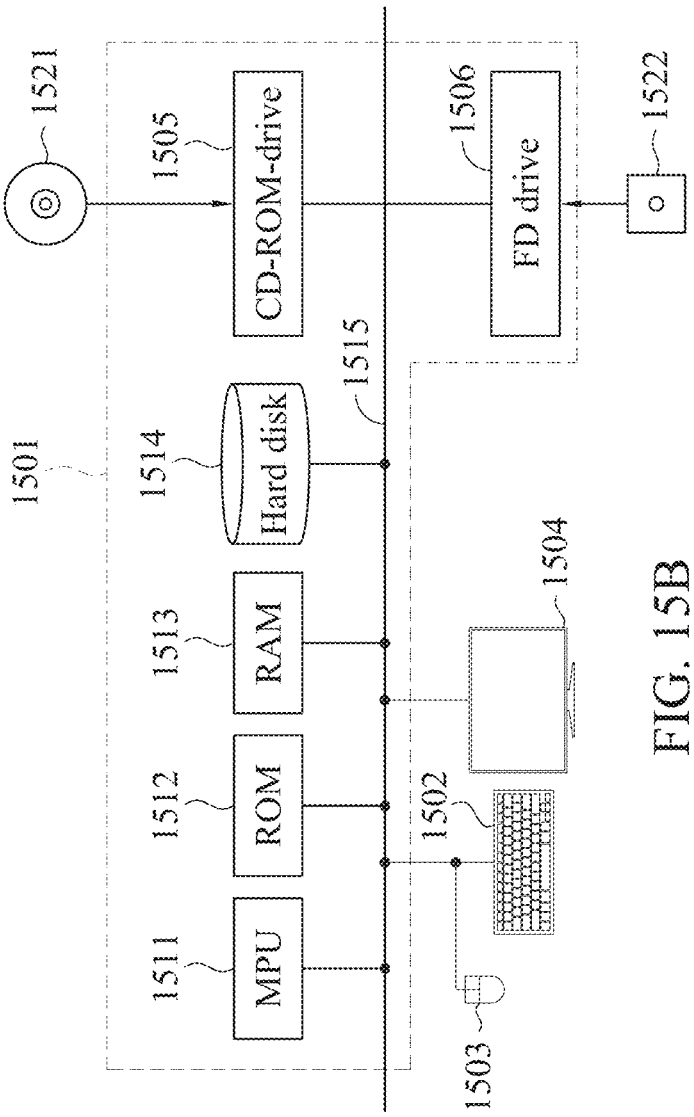

FIGS. 15A and 15B illustrate a computer system 1500 for analyzing and adjusting the layout pattern of a photo mask, in accordance with some embodiments of the present disclosure. In some embodiments, the computer system 1500 is used for performing the functions of the modules of FIG. 13 that include translation-rotation module 1340, analyzer module 1350, layout adjustment module 1360, mask projector 1380 to simulate the projection, and error module 1370. FIG. 15A is a schematic view of a computer system that performs the functions of an apparatus for adjusting a layout pattern of a mask. All of or a part of the processes, method and/or operations of the foregoing embodiments can be realized using computer hardware and computer programs executed thereon. In FIG. 15A, a computer system 1500 is provided with a computer 1501 including an optical disk read only memory (e.g., CD-ROM or DVD-ROM) drive 1505 and a magnetic disk drive 1506, a keyboard 1502, a mouse 1503, and a monitor 1504.

FIG. 15B is a diagram showing an internal configuration of the computer system 1500. In FIG. 15B, the computer 1501 is provided with, in addition to the optical disk drive 1505 and the magnetic disk drive 1506, one or more processors, such as a micro processing unit (MPU), a ROM 1512 in which a program such as a boot up program is stored, a random access memory (RAM) 1513 that is connected to the MPU 1511 and in which a command of an application program is temporarily stored and a temporary storage area is provided, a hard disk 1514 in which an application program, a system program, and data are stored, and a bus 1515 that connects the MPU 1511, the ROM 1512, and the like. Note that the computer 1501 may include a network card (not shown) for providing a connection to a LAN.

The program for causing the computer system 1500 to execute the functions of an apparatus for performing the analyzing and adjusting the layout pattern of a mask in the foregoing embodiments may be stored in an optical disk 1521 or a magnetic disk 1522, which are inserted into the optical disk drive 1505 or the magnetic disk drive 1506, and transmitted to the hard disk 1514. Alternatively, the program may be transmitted via a network (not shown) to the computer 1501 and stored in the hard disk 1514. At the time of execution, the program is loaded into the RAM 1513. The program may be loaded from the optical disk 1521 or the magnetic disk 1522, or directly from a network. The program does not necessarily have to include, for example, an operating system (OS) or a third party program to cause the computer 1501 to execute the functions of analyzing and adjusting in the foregoing embodiments. The program may only include a command portion to call an appropriate function (module) in a controlled mode and obtain desired results.

According to some embodiments of the present disclosure, a method for adjusting a layout pattern of a mask includes shifting and/or rotating an entire layout pattern based on information of a plurality of defects of a mask-blank to avoid an impact of one of one or more first defects of the plurality of defects when the layout pattern is produced as a mask on the mask-blank. The mask is projected on a wafer to generate the layout pattern on the wafer. The method also includes adjusting the layout pattern of the mask at a first location based on information of a second defect of a remaining of the plurality of defects to reduce, based on a first acceptance criterion, an impact of the second defect on the layout pattern of the wafer. The method further includes adjusting the layout pattern of the mask at a second location based on information of a third defect of the remaining of the plurality of defects and distinct from the second defect to shift an impact position of the third defect on the layout pattern of the wafer based on a second acceptance criterion. In an embodiment, the method further includes obtaining the information of the plurality of defects from either of a defect detection system or a manufacturer of the mask-blank. In an embodiment, the first acceptance criterion includes a first impact error associated with the second defect and the second acceptance criterion includes a second impact error associated with the third defect and the method further includes adjusting the layout pattern of the mask based on the information of the second defect until the first impact error associated with the second defect satisfies a first threshold level and also includes adjusting the layout pattern of the mask based on the information of the third defect until the second impact error associated with the third defect satisfies a second threshold level. In an embodiment, the method further includes modifying a geometric shape of the layout pattern of the mask at the first location to set the first impact error associated with the second defect below the first threshold level. In an embodiment, the layout pattern on the wafer is a photo resist layout pattern and the method further includes determining a reduction in a critical dimension (CD) value of a critical feature of the photo resist layout pattern of the wafer as the first impact error and also includes modifying a geometric shape of the layout pattern of the mask at the first location to set the reduction of the CD value associated with the second defect below the first threshold level. In an embodiment, the method further includes modifying a geometric shape of the layout pattern of the mask at the second location to set the second impact error associated with the third defect below the second threshold level. In an embodiment, the second location is at or near a location of the third defect and the method further includes determining an inverse of a distance between a location of a defect produced by the third defect on the wafer and a critical feature of the photo resist layout pattern of the wafer as the second impact error, wherein the second impact error is set below the second threshold level. In an embodiment, the method further includes prior to the shifting and/or the rotating the entire layout pattern, inspecting the mask-blank to determine the plurality of defects. In an embodiment, the plurality of defects are determined with respect to a reference point of the mask-blank and the method further includes shifting the entire layout pattern with respect to the reference point of the mask-blank and rotating the entire layout pattern around the reference point of the mask-blank. In an embodiment, the first location is at or near the second defect and the adjusting the layout pattern of the mask at the first location includes removing a portion of the layout pattern of the mask at the first location to either: eliminate the first impact error associated with the second defect, or decrease the first impact error associated with the second defect. In an embodiment, the second location is at or near the third defect and the adjusting the layout pattern of the mask at the second location includes adding one or more additional patterns to the layout pattern of the mask at the second location.

According to some embodiments of the present disclosure, a method for adjusting a layout pattern of a mask includes obtaining a plurality of defects of a mask-blank and obtaining a layout pattern to be produced as a mask on the mask-blank. The method includes adjusting the layout pattern at one or more first locations based on information of one or more first defects of the plurality of defects to: eliminate an impact of a portion of the one or more first defects on a layout pattern generated by projecting the mask on a wafer and reduce an impact of each one of a remaining portion of the one or more first defects on the layout pattern of the wafer based on a first acceptance criterion. In an embodiment, the method further includes adjusting the layout pattern of the mask at one or more second locations based on information of one or more second defects, distinct from the first defects of the plurality of defects, to shift impact positions of the second defects on the layout pattern of the wafer based on a second acceptance criterion. In an embodiment, the adjusting the layout pattern of the mask at the one or more first locations includes removing a portion of the layout pattern of the mask at the one or more first locations and the adjusting the layout pattern of the mask at the one or more second locations includes adding one or more additional patterns to the layout pattern of the mask at the one or more second locations.

According to some embodiments of the present disclosure, a control system for adjusting a layout pattern of a mask includes a mask projector configured to project the layout pattern of the mask as a photo resist layout pattern on a wafer. The control system includes an analyzer module coupled to the mask projector. The analyzer module receives information of a plurality of defects of a mask-blank and the layout pattern of the mask. The layout pattern is produced as the mask on the mask-blank. The analyzer module shifts and/or rotates an entire layout pattern of the mask based on the information of the plurality of defects of the mask-blank to avoid an impact of each one of one or more first defects of the plurality of defects when the layout pattern is produced as the mask on the mask-blank. The analyzer module further adjusts the layout pattern of the mask at a first location based on the information of a second defect of a remaining of the plurality of defects to eliminate an impact of the second defect on the photo resist layout pattern of the wafer, or reduce, based on an acceptance criterion, an impact of the second defect on the layout pattern of the wafer. In an embodiment, the control system includes a layout adjustment module coupled to the analyzer module to modify the layout pattern of the mask at or near a location of a defect of the remaining of the plurality of defects. The modification of the layout pattern is compensated by the defect and the layout adjustment module sends the modified layout pattern of the mask to the analyzer module. In an embodiment, the acceptance criterion includes an impact error associated with the second defect and the impact error is a reduction in a critical dimension (CD) value of a critical feature of the photo resist layout pattern at or near the second defect. In an embodiment, the impact error is a percentage in the reduction of the CD of the critical feature of the photo resist layout pattern and the impact error is maintained below a threshold level of 20 percent. In an embodiment, the mask projector receives the layout pattern of the mask from the analyzer module and the analyzer module receives the photo resist layout pattern of the wafer from the mask projector. In an embodiment, the control system further includes a translation-rotation module that is coupled to the analyzer module and determines a translation direction and amount and a rotation direction and amount based on the information of the plurality of defects of the mask-blank to avoid the impact of the one or more first defects. The translation-rotation module sends the translation direction and amount and the rotation direction and amount to the analyzer module.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    shifting or rotating an entire layout pattern based on information of a plurality of defects of a mask-blank to avoid an impact of one of one or more first defects of the plurality of defects when the layout pattern is produced as a mask on the mask-blank, wherein the mask is projected on a wafer to generate a photo resist pattern on the wafer;
    modifying a geometric shape of the layout pattern of the mask at a first location based on information of a second defect of a remaining of the plurality of defects to reduce, based on a first acceptance criterion, an impact of the second defect on the photo resist pattern generated on the wafer; and
    adjusting the layout pattern of the mask at a second location based on information of a third defect of the remaining of the plurality of defects and distinct from the second defect to shift an impact position caused by the third defect on the photo resist pattern based on a second acceptance criterion.

2. The method of claim 1, further comprising:
    obtaining the information of the plurality of defects from either of:
        a defect detection system, or
        a manufacturer of the mask-blank.

3. The method of claim 1, wherein the first acceptance criterion comprises a first impact error associated with the second defect and the second acceptance criterion comprises a second impact error associated with the third defect, wherein:
    the layout pattern of the mask is adjusted based on the information of the second defect until the first impact error associated with the second defect satisfies a first threshold level, and wherein the information of the second defect comprises a size or location of the second defect; and
    the layout pattern of the mask is adjusted based on the information of the third defect until the second impact error associated with the third defect satisfies a second threshold level, and wherein the information of the third defect comprises a size or location of the third defect.

4. The method of claim 3, the method further comprising:
    determining a reduction in a critical dimension (CD) value of a critical feature of the photo resist pattern of the wafer as the first impact error; and modifying the geometric shape of the layout pattern of the mask at the first location to set the reduction of the CD value associated with the second defect below the first threshold level.

5. The method of claim 3, wherein the first location is at or near the second defect, and wherein the adjusting the layout pattern of the mask at the first location comprises:
reducing a thickness of a rectangular section of the layout pattern of the mask at the first location to either:
eliminate the first impact error associated with the second defect, or
decrease the first impact error associated with the second defect.

6. The method of claim 3, wherein:
the geometric shape of the layout pattern of the mask at the first location is modified to reduce the first impact error associated with the second defect to a value below the first threshold level; and
the geometric shape of the layout pattern of the mask at the second location is modified to reduce the second impact error associated with the third defect to a value below the second threshold level.

7. The method of claim 3, wherein:
the geometric shape of the layout pattern of the mask at the first location is modified such that a combination of the modified layout pattern and the second defect generate a target pattern on the wafer.

8. The method of claim 3, wherein the second location is at or near a location of the third defect, the method further comprising:
determining an inverse of a distance between a location of a defect produced by the third defect on the photo resist pattern and a critical feature of the photo resist pattern as the second impact error, wherein the second impact error is reduced to a value below the second threshold level.

9. The method of claim 1, wherein the second location is at or near the third defect, wherein the adjusting the layout pattern of the mask at the second location comprises:
adding one or more additional patterns to the layout pattern of the mask at the second location.

10. A method, comprising:
determining a plurality of defects of a mask-blank;
obtaining a layout pattern to be produced as a mask on the mask-blank;
adjusting the layout pattern to be produced as the mask based on information of two or more first defects of the plurality of defects to:
eliminate an impact of a first portion of the w or more first defects on a resist pattern generated by projecting the mask on a wafer by shifting or rotating an entire layout pattern to avoid the first portion of the w or more first defects; and
reduce an impact of each one of a remaining second portion of the t or more first defects on the resist pattern on the wafer based on a first acceptance criterion, wherein a geometric shape of the layout pattern of the mask is modified such that a combination of the modified layout pattern and the second portion of the two or more first defects generate a target pattern on the wafer.

11. The method of claim 10, further comprising:
adjusting the layout pattern of the mask at one or more second locations based on information of one or more second defects, distinct from the two or more first defects of the plurality of defects, to cause a shift of impact positions of the second defects on the resist pattern of the wafer based on a second acceptance criterion.

12. The method of claim 11, wherein reducing the impact of each one of the remaining second portion of the t or more first defects comprises:
removing a section of a geometric shape of the layout pattern of the mask at one or more first locations, wherein each one of the two or more first defects at one of the one or more first locations produces an effect of the removed section when the mask is projected on the wafer; and
wherein the adjusting the layout pattern of the mask at the one or more second locations comprises:
adding one or more additional geometric shapes to the layout pattern of the mask at the one or more second locations.

13. The method of claim 10, wherein the plurality of defects are determined with respect to a reference point of the mask-blank, wherein the entire layout pattern is shifted with respect to the reference point of the mask-blank, and wherein the entire layout pattern is rotated around the reference point of the mask-blank.

14. The method of claim 10, further comprising:
inspecting the mask-blank to determine the plurality of defects.

15. A control system for adjusting a layout pattern of a mask, comprising:
a mask projector configured to project the layout pattern of the mask as a resist pattern on a wafer; and
an analyzer module coupled to the mask projector, wherein the analyzer module is configured to receive information of a plurality of defects of a mask-blank and the layout pattern of the mask, wherein the layout pattern is produced as the mask on the mask-blank, and wherein the analyzer module is configured to:
shift or rotate an entire layout pattern of the mask based on the information of the plurality of defects of the mask-blank to avoid an impact of each one of one or more first defects of the plurality of defects when the layout pattern is produced as the mask on the mask-blank; and
modify a geometric shape of the layout pattern of the mask at a first location based on the information of a second defect of a remaining of the plurality of defects to:
eliminate an impact of the second defect on the resist pattern of the wafer, or
reduce, based on an acceptance criterion, an impact of the second defect on the resist pattern of the wafer.

16. The control system of claim 15, further comprising:
a layout adjustment module coupled to the analyzer module and configured to modify the layout pattern of the mask at or near a location of a defect of the remaining of the plurality of defects, wherein the modification of the layout pattern reduces a thickness of a rectangular section of the layout pattern, wherein the reduced thickness is compensated by the defect, and wherein the layout adjustment module is configured to send the modified layout pattern of the mask to the analyzer module.

17. The control system of claim 15, wherein the acceptance criterion comprises an impact error associated with the second defect and the impact error is a reduction in a critical dimension (CD) value of a critical feature of the resist pattern at or near the second defect.

18. The control system of claim 17, wherein the impact error is defined as a percentage in the reduction of the CD of the critical feature of the resist pattern, and wherein the impact error is maintained below a threshold level of 20 percent.

19. The control system of claim 15, wherein the mask projector is configured to receive the layout pattern of the mask from the analyzer module, and wherein the analyzer module is configured to receive the resist pattern of the wafer from the mask projector.

20. The control system of claim 15, further comprising:
- a translation-rotation module coupled to the analyzer module and configured to determine a translation direction and amount and a rotation direction and amount based on the information of the plurality of defects of the mask-blank to avoid the impact of the one or more first defects, wherein the translation-rotation module is configured to send the translation direction and amount and the rotation direction and amount to the analyzer module.

* * * * *